United States Patent
Tanitsu

(10) Patent No.: US 8,913,227 B2
(45) Date of Patent: Dec. 16, 2014

(54) ILLUMINATION OPTICAL SYSTEM, ALIGNER, AND PROCESS FOR FABRICATING DEVICE

(75) Inventor: Osamu Tanitsu, Kumagaya (JP)

(73) Assignee: Nikon Corporation, Tokyo (JP)

( * ) Notice: Subject to any disclaimer, the term of this patent is extended or adjusted under 35 U.S.C. 154(b) by 197 days.

(21) Appl. No.: 12/929,944

(22) Filed: Feb. 25, 2011

(65) Prior Publication Data

US 2011/0211183 A1 Sep. 1, 2011

Related U.S. Application Data

(63) Continuation of application No. PCT/JP2009/063992, filed on Aug. 7, 2009.

(60) Provisional application No. 61/136,338, filed on Aug. 28, 2008.

(51) Int. Cl.
    G03F 7/20 (2006.01)
(52) U.S. Cl.
    CPC ........ G03F 7/70116 (2013.01); G03F 7/70108 (2013.01)
    USPC .............................................. 355/67; 355/71
(58) Field of Classification Search
    CPC ............ G03F 7/70091; G03F 7/70116; G03F 7/70191; G03F 7/70208; G03F 7/70161
    USPC .................... 355/53, 67, 71, 77, 68
    See application file for complete search history.

(56) References Cited

U.S. PATENT DOCUMENTS

| | | | |
|---|---|---|---|
| 5,229,872 A | 7/1993 | Mumola | |
| 5,312,513 A | 5/1994 | Florence et al. | |
| 5,684,566 A * | 11/1997 | Stanton | 355/67 |
| 6,771,350 B2 | 8/2004 | Nishinaga | |
| 6,885,493 B2 | 4/2005 | Ljungblad et al. | |
| 6,891,655 B2 | 5/2005 | Grebinski et al. | |
| 6,900,915 B2 | 5/2005 | Nanjyo et al. | |
| 6,913,373 B2 | 7/2005 | Tanaka et al. | |
| 6,927,836 B2 | 8/2005 | Nishinaga | |
| 7,061,582 B2 * | 6/2006 | Zinn et al. | 355/67 |
| 7,095,546 B2 | 8/2006 | Mala et al. | |
| 7,714,983 B2 * | 5/2010 | Koehler et al. | 355/67 |

(Continued)

FOREIGN PATENT DOCUMENTS

| | | |
|---|---|---|
| EP | 0 779 530 A1 | 6/1997 |
| EP | 1184727 A1 * | 3/2002 |

(Continued)

OTHER PUBLICATIONS

International Search Report, dated Oct. 21, 2009.

(Continued)

*Primary Examiner* — Steven H Whitesell Gordon

(57) ABSTRACT

According to one embodiment, an illumination optical system configured to illuminate an illumination target surface on the basis of light from a light source comprises a distribution forming optical system and a correction unit. The distribution forming optical system forms a pupil intensity distribution on an illumination pupil of the illumination optical system. The correction unit changes an emission direction of a beam according to an incidence position of the beam, in order to correct the pupil intensity distribution. The correction unit is arranged at or near a position of the illumination pupil, or, arranged at or near a position optically conjugate with the illumination pupil.

28 Claims, 22 Drawing Sheets

(56) References Cited

U.S. PATENT DOCUMENTS

| | | | |
|---|---|---|---|
| 2003/0038225 A1* | 2/2003 | Mulder et al. | 250/205 |
| 2004/0057034 A1* | 3/2004 | Zinn et al. | 355/67 |
| 2004/0108467 A1 | 6/2004 | Eurlings et al. | |
| 2005/0095749 A1 | 5/2005 | Krellmann et al. | |
| 2005/0286106 A1* | 12/2005 | Kimura | 359/237 |
| 2006/0055834 A1 | 3/2006 | Tanitsu et al. | |
| 2006/0170901 A1 | 8/2006 | Tanitsu et al. | |
| 2007/0014112 A1 | 1/2007 | Ohya et al. | |
| 2007/0165202 A1 | 7/2007 | Koehler et al. | |
| 2007/0195305 A1 | 8/2007 | Mulder et al. | |
| 2008/0013065 A1* | 1/2008 | Kohl | 355/67 |
| 2008/0030707 A1 | 2/2008 | Tanaka et al. | |
| 2008/0239503 A1* | 10/2008 | Conradi et al. | 359/666 |
| 2009/0091730 A1* | 4/2009 | Tanaka | 355/67 |
| 2009/0097007 A1* | 4/2009 | Tanaka | 355/67 |
| 2009/0097094 A1* | 4/2009 | Tanaka | 359/239 |
| 2009/0117494 A1* | 5/2009 | Owa | 430/322 |
| 2009/0135392 A1* | 5/2009 | Muramatsu | 355/67 |
| 2009/0262324 A1* | 10/2009 | Patra et al. | 355/68 |

FOREIGN PATENT DOCUMENTS

| | | |
|---|---|---|
| JP | 11-3849 | 1/1999 |
| JP | 11-003849 | 1/1999 |
| JP | 2002-506230 | 2/2002 |
| JP | 2002-353105 | 12/2002 |
| JP | 2003-22967 | 1/2003 |
| JP | 2004-304135 | 10/2004 |
| JP | 2005-345938 | 12/2005 |
| JP | 2006-59834 | 3/2006 |
| JP | 2006-113437 | 4/2006 |
| JP | 2007-505488 | 3/2007 |
| JP | 2007-227918 | 9/2007 |
| WO | WO 99/45435 | 9/1999 |
| WO | WO 2005/026843 | 3/2005 |
| WO | 2005/048326 A1 | 5/2005 |
| WO | 2006/080285 A1 | 8/2006 |
| WO | 2007/017089 A1 | 2/2007 |
| WO | WO 2009080231 A1 * | 7/2009 |

OTHER PUBLICATIONS

International Search Report for PCT/JP2009/063992 mailed Nov. 2, 2009.

Japanese Office Action issued Jul. 16, 2013 in corresponding Japanese Application No. 2010-526640.

Japanese Office Action dated Mar. 3, 2014 in corresponding Japanese Application No. 2010-526640.

* cited by examiner

Fig.3
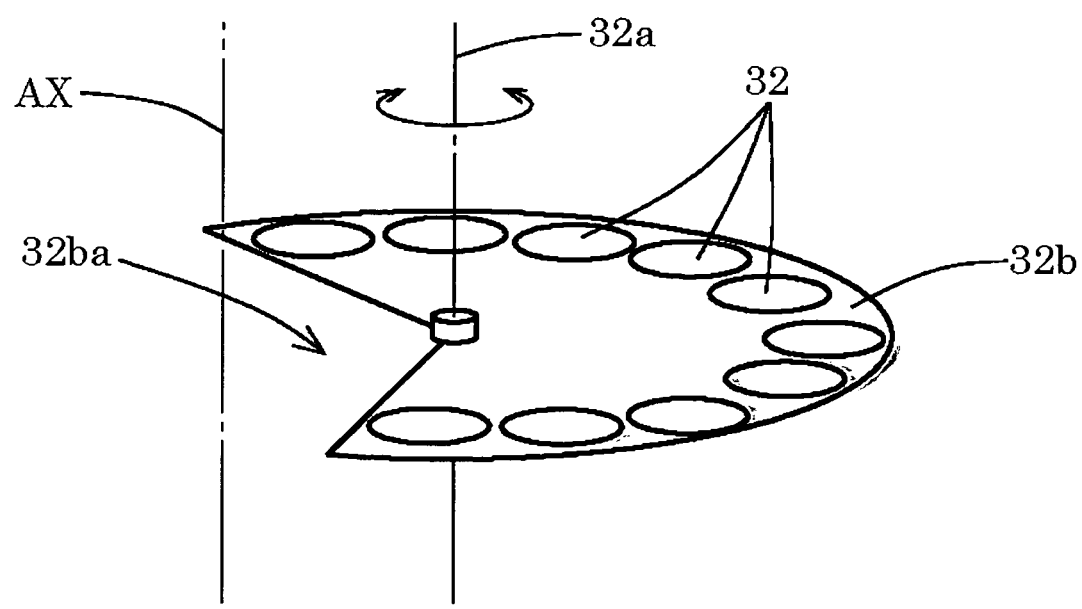
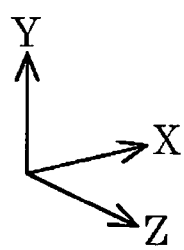

Fig.4
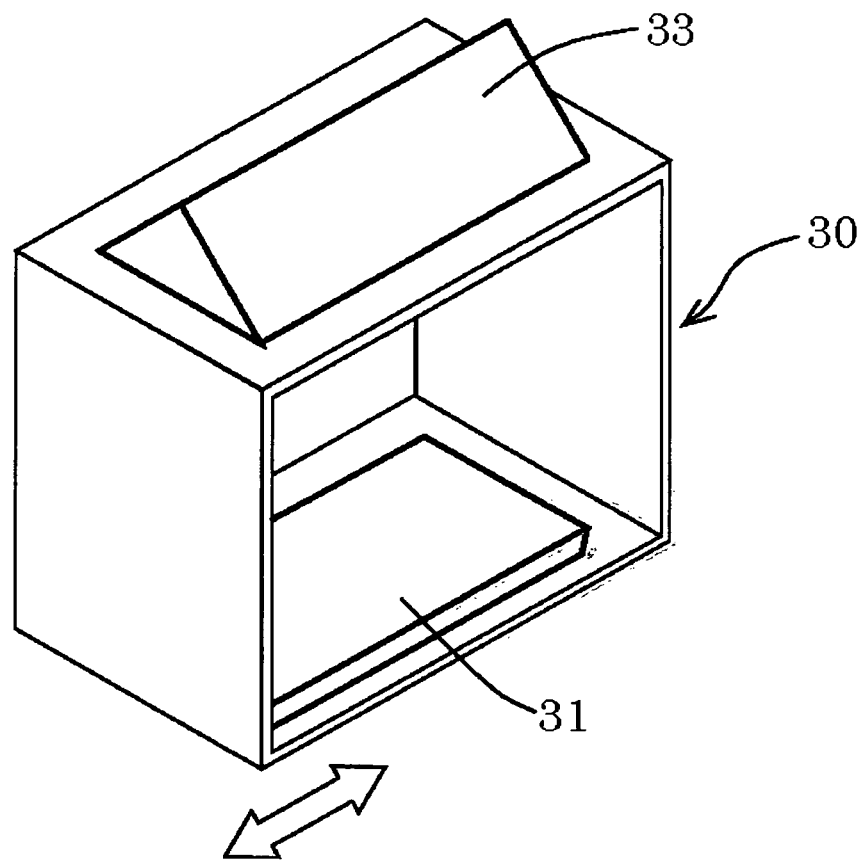
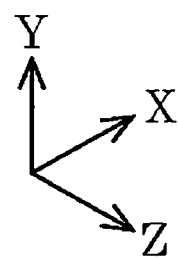

*Fig.8*
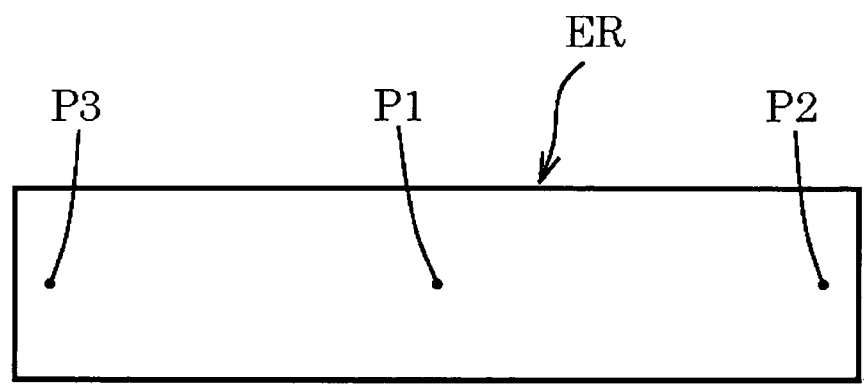
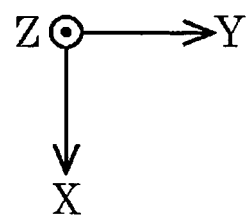

ILLUMINATION OPTICAL SYSTEM, ALIGNER, AND PROCESS FOR FABRICATING DEVICE

CROSS-REFERENCE TO RELATED APPLICATIONS

This application is a continuation application of PCT Application serial No. PCT/JP2009/063992 Aug. 7, 2009 claiming the benefit of priority of U.S. Provisional Application No. 61/136,338 filed on Aug. 28, 2008, the entire contents of which are incorporated herein by reference.

BACKGROUND

In a typical exposure apparatus of this type, a light beam emitted from a light source travels through a fly's eye lens as an optical integrator to form a secondary light source (a predetermined light intensity distribution on an illumination pupil in general) as a substantial surface illuminant consisting of a large number of light sources. The light intensity distribution on the illumination pupil will be referred to hereinafter as a "pupil intensity distribution." The illumination pupil is defined as a position such that an illumination target surface becomes a Fourier transform plane of the illumination pupil by action of an optical system between the illumination pupil and the illumination target surface (a mask or a wafer in the case of the exposure apparatus).

Beams from the secondary light source are condensed by a condenser lens to illuminate the mask with a predetermined pattern thereon in a superimposed manner. Light passing through the mask travels through a projection optical system to be focused on the wafer, whereby the mask pattern is projected (or transferred) onto the wafer to effect exposure thereof. Since the pattern formed on the mask is a highly integrated one, an even illuminance distribution must be obtained on the wafer in order to accurately transfer this microscopic pattern onto the wafer.

In order to accurately transfer the microscopic pattern of the mask onto the wafer, there is a proposed technique to form, for example, a pupil intensity distribution of a multipolar shape (dipolar, quadrupolar, or other shape) to improve the depth of focus and the resolution of the projection optical system (cf. U.S. Patent Application Laid-Open No. 2006/0055834).

SUMMARY

According to an embodiment, an illumination optical system configured to illuminate an illumination target surface on the basis of light from a light source, comprising: a distribution forming optical system forming a pupil intensity distribution on an illumination pupil of the illumination optical system; and a correction unit, for correcting the pupil intensity distribution, changing an emission direction of a beam according to an incidence position of the beam, the correction unit being arranged at or near a position of the illumination pupil, or, arranged at or near a position optically conjugate with the illumination pupil.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

FIG. 3 is an exemplary perspective view schematically showing a major configuration of an inserting/retracting mechanism of diffractive optical elements;

FIG. 4 is an exemplary perspective view schematically showing a configuration of a frame member holding a triangular prism and a reflecting member;

FIG. 8 is an exemplary drawing showing a rectangular still exposure region formed on a wafer;

DETAILED DESCRIPTION

Various embodiments will be described hereinafter with reference to the accompanying drawings.

Figure 1:
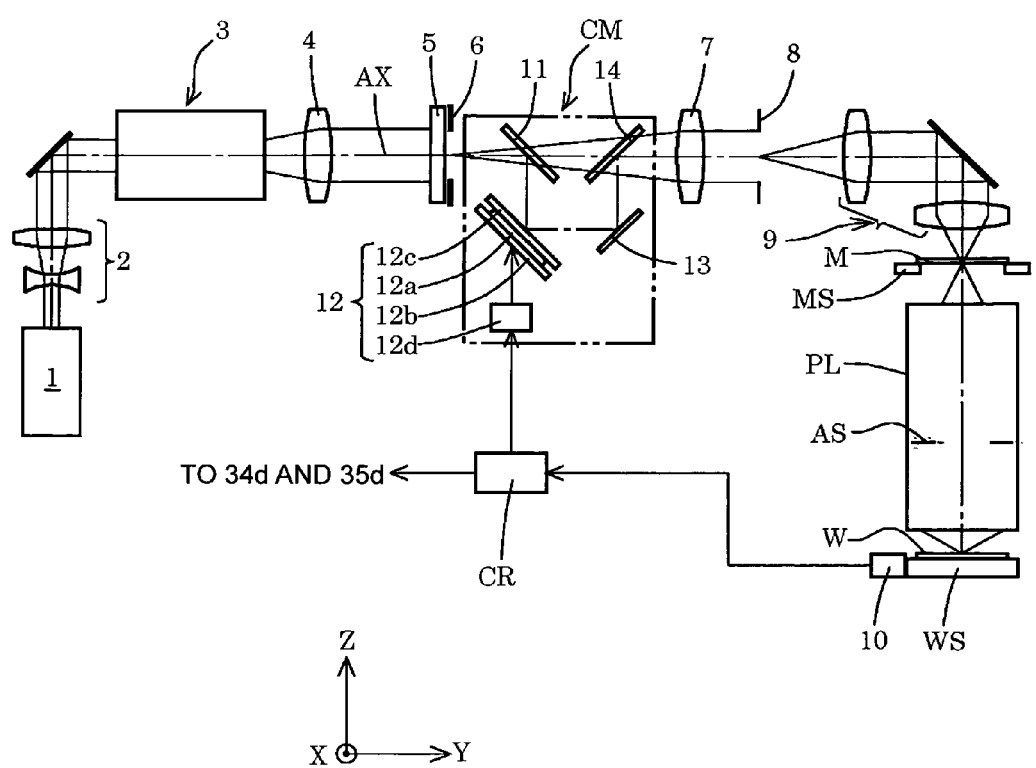
FIG. 1 is an exemplary drawing schematically showing a configuration of an exposure apparatus according to the first embodiment.
Figure 2:
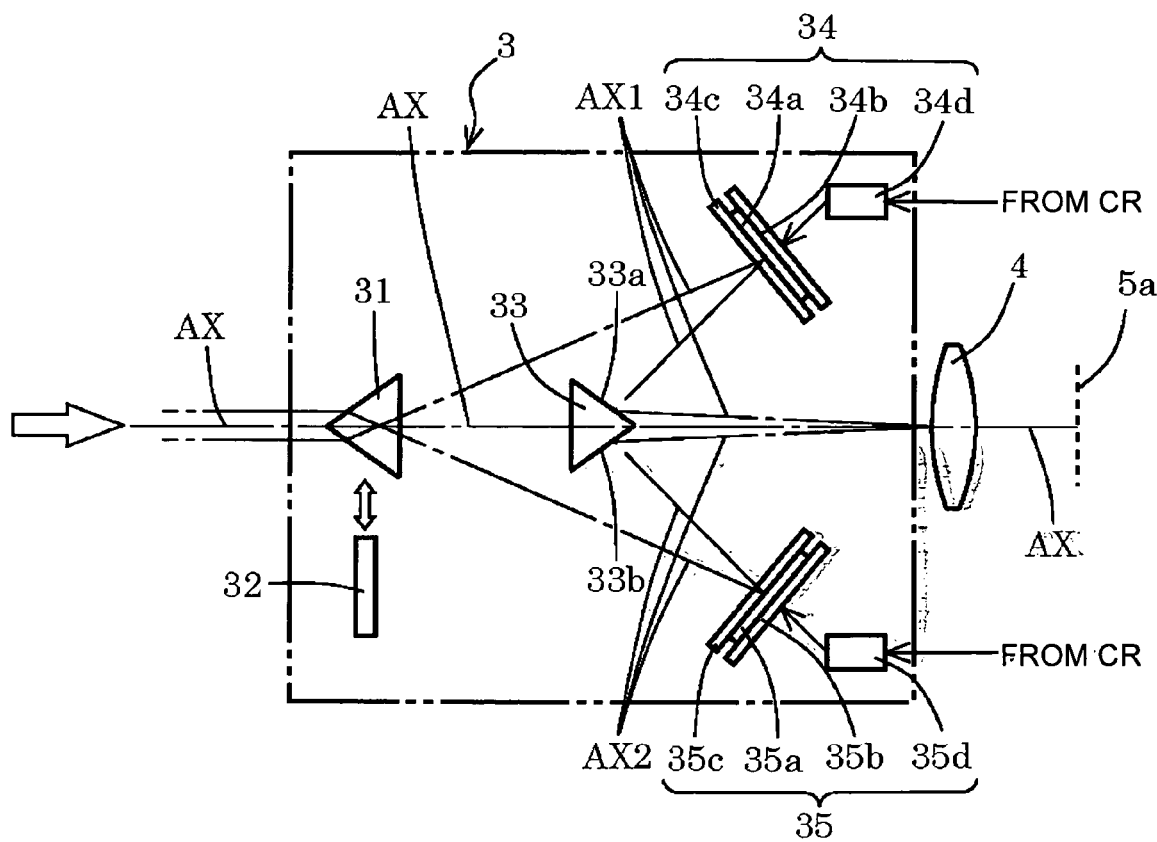
FIG. 2 is an exemplary drawing schematically showing an internal configuration of a spatial light modulation unit in FIG. 1.

FIG. 1 is an exemplary drawing schematically showing a configuration of an exposure apparatus according to the first embodiment. FIG. 2 is an exemplary drawing schematically showing an internal configuration of a spatial light modulation unit shown in FIG. 1. In FIG. 1, the Z-axis is set along a direction of a normal to a transfer surface (exposure surface) of a wafer W being a photosensitive substrate, the Y-axis along a direction parallel to the plane of FIG. 1 in the transfer surface of the wafer W, and the X-axis along a direction normal to the plane of FIG. 1 in the transfer surface of the wafer W.

With reference to FIG. 1, the exposure apparatus of the first embodiment receives exposure light (illumination light) supplied from a light source 1. The light source 1 applicable herein is, for example, an ArF excimer laser light source which supplies light at the wavelength of 193 nm or a KrF excimer laser light source which supplies light at the wavelength of 248 nm. The light emitted from the light source 1 is expanded into a beam of a required cross-sectional shape by a shaping optical system 2 and the expanded beam is incident to the spatial light modulation unit 3.

The spatial light modulation unit 3, as shown in FIG. 2, is provided with a triangular prism 31 which can be set at a predetermined position in an illumination optical path along an optical axis AX being the fundamental optical axis of an illumination optical system, a plurality of diffractive optical elements 32 which can be selectively set at a predetermined position (e.g., a position approximately identical to the set position of the triangular prism 31) in the illumination optical path, and a reflecting member 33 which can be set at a position in the illumination optical path behind the set position of the triangular prism 31

Furthermore, the spatial light modulation unit 3 is provided with a pair of spatial light modulators 34 and 35 fixedly set off the illumination optical path. The specific configuration and action of the spatial light modulation unit 3 will be described later. In the description below, for easier understanding of the configuration and action of the exposure apparatus, it is assumed that a diffractive optical element 32 for annular illumination is set in the illumination optical path and that the triangular prism 31 and reflecting member 33 are not set in the illumination optical path.

In this case, the light from the light source 1 through the shaping optical system 2 is incident along the optical axis AX into the diffractive optical element 32. The diffractive optical element 32 for annular illumination has such a function that, for example, with incidence of a parallel beam with a rectangular cross section along the optical axis AX, it forms an annular light intensity distribution around the optical axis AX in the far field (or in the Fraunhofer diffraction region). The light traveling via the diffractive optical element 32 and emitted from the spatial light modulation unit 3, then travels through a relay optical system 4 to enter a micro fly's eye lens (or fly's eye lens) 5.

The relay optical system 4 is so set that its front focal position is approximately coincident with the position of the diffractive optical element 32 and that its rear focal position is approximately coincident with a position of an entrance plane 5a of the micro fly's eye lens 5. Therefore, the light having traveled via the diffractive optical element 32 forms, for example, an annular light intensity distribution around the optical axis AX on the entrance plane 5a of the micro fly's eye lens 5. The micro fly's eye lens 5 is, for example, an optical element consisting of a large number of microscopic lenses with a positive refractive power arrayed vertically and horizontally and densely, and it is constructed by forming the microscopic lens group by etching of a plane-parallel plate.

In the micro fly's eye lens, unlike a fly's eye lens consisting of mutually-isolated lens elements, the large number of microscopic lenses (microscopic refracting faces) are integrally formed without being isolated from each other. However, the micro fly's eye lens is an optical integrator of the same wavefront division type as the fly's eye lens in that the lens elements are arranged vertically and horizontally. The rectangular microscopic refracting faces as unit wavefront division faces in the micro fly's eye lens 5 are of a rectangular shape similar to a shape of an illumination field to be formed on a mask M (and, therefore, similar to a shape of an exposure region to be formed on the wafer W). It is noted that, for example, a cylindrical micro fly's eye lens can also be used as the micro fly's eye lens 5. The configuration and action of the cylindrical micro fly's eye lens are disclosed, for example, in U.S. Pat. No. 6,913,373.

The beam incident into the micro fly's eye lens 5 is two-dimensionally divided by the large number of microscopic lenses to form a secondary light source with a light intensity distribution nearly equal to the illumination field formed by the incident beam, i.e., a secondary light source consisting of a substantial surface illuminant of an annular shape around the optical axis AX (annular pupil intensity distribution), on an illumination pupil at or near the rear focal plane of the micro fly's eye lens 5. Beams from the secondary light source formed on or near the rear focal plane of the micro fly's eye lens 5 are then incident to an aperture stop 6 arranged near it.

The aperture stop 6 has an annular aperture (light transmitting portion) corresponding to the annular secondary light source formed on or near the rear focal plane of the micro fly's eye lens 5. The aperture stop 6 is configured so as to be freely inserted into or retracted from the illumination optical path and so as to be switchable among a plurality of aperture stops with apertures of different sizes and shapes. A switching method of the aperture stops applicable herein is, for example, a well-known turret method or slide method. The aperture stop 6 is arranged at a position approximately optically conjugate with an entrance pupil plane of a projection optical system PL described below, to define a scope of contribution to illumination by the secondary light source.

The beams from the secondary light source limited by the aperture stop 6 successively travel through a pair of beam splitters 11 and 14 and thereafter through a condenser optical system 7 to illuminate a mask blind 8 in a superimposed manner. In this way, a rectangular illumination field according to the shape and focal length of the rectangular microscopic refracting faces of the micro fly's eye lens 5 is formed on the mask blind 8 as an illumination field stop. On the other hand, light reflected by the beam splitter 11 and guided from the illumination optical path into a split optical path travels via a spatial light modulator 12, a plane mirror 13, and the beam splitter 14 to return to the illumination optical path.

The pair of beam splitters 11, 14, the spatial light modulator 12, and the plane mirror 13 constitute a correction unit CM for correcting (or adjusting) the pupil intensity distribution. The specific configuration and action of the correction unit CM will be described later. Beams through a rectangular aperture (light transmitting portion) of the mask blind 8 are subjected to the condensing action of imaging optical system 9 and thereafter illuminate the mask M with a predetermined pattern thereon in a superimposed manner. Namely, the imaging optical system 9 forms an image of the rectangular aperture of the mask blind 8 on the mask M.

The pattern to be transferred is formed on the mask M held on a mask stage MS and is illuminated in a pattern region of a rectangular shape (slit shape) having long sides along the Y-direction and short sides along the X-direction in the entire pattern region. Light transmitted by the pattern region on the mask M travels through the projection optical system PL to form an image of the mask pattern on the wafer (photosensitive substrate) W held on a wafer stage WS. Namely, the pattern image is formed in a still exposure region (effective exposure region) of a rectangular shape having long sides along the Y-direction and short sides along the X-direction on the wafer W as well, so as to optically correspond to the rectangular illumination region on the mask M.

In this way, in accordance with the so-called step-and-scan method, the mask stage MS and the wafer stage WS and, therefore, the mask M and the wafer W are synchronously moved (or scanned) along the X-direction (scanning direction) in a plane (XY plane) perpendicular to the optical axis AX of the projection optical system PL, thereby implementing scanning exposure of the mask pattern in a shot area (exposure region) with the width equal to the Y-directional size of the still exposure region and the length according to a scanning amount (moving distance) of the wafer W, on the wafer W.

In the first embodiment, as described above, the mask M arranged on an illumination target surface for the illumination optical system (2-9) is illuminated by Köhler illumination using the secondary light source formed by the micro fly's eye lens 5, as a light source. For this reason, the position where the secondary light source is formed is optically conjugate with the position of an aperture stop AS of the projection optical system PL, and therefore the plane where the secondary light source is formed can be called an illumination pupil plane of the illumination optical system (2-9). Typically, the illumination target surface (which is the surface where the mask M is arranged, or the surface where the wafer W is arranged in the case where the illumination optical system is considered to include the projection optical system PL) is an optical Fourier transform plane with respect to the illumination pupil plane. The pupil intensity distribution is a light intensity distribution (luminance distribution) on the illumination pupil plane of the illumination optical system (2-9) or on a plane optically conjugate with the illumination pupil plane.

When the number of wavefront divisions by the micro fly's eye lens 5 is relatively large, the global light intensity distribution formed on the entrance plane of the micro fly's eye lens 5 demonstrates a high correlation with the global light intensity distribution (pupil intensity distribution) of the whole secondary light source. For this reason, the light intensity distributions on the entrance plane of the micro fly's eye lens 5 and on any plane optically conjugate with the entrance plane can also be called pupil intensity distributions. In the configuration of FIG. 1, the spatial light modulation unit 3, relay optical system 4, and micro fly's eye lens 5 constitute a distribution forming optical system which forms the pupil intensity distribution on the illumination pupil behind the micro fly's eye lens 5.

In the spatial light modulation unit 3, as shown in FIG. 3, a plurality of diffractive optical elements 32 with properties different from each other are attached to a rotary plate 32b which can rotate around an axis parallel to the optical axis AX, e.g., around an axis 32a extending in the Y-direction with a space in the +X-direction from the optical axis AX. A cut 32ba of a fan shape defined by a pair of line segments passing the axis 32a is formed in the rotary plate 32b and the plurality of diffractive optical elements 32 are attached to the rotary plate 32b as spaced along a circle centered on the axis 32a. In this manner, a desired diffractive optical element 32 is selectively set at the predetermined position in the illumination optical path, through rotation of the rotary plate 32b around the axis 32a. Furthermore, positioning of the cut 32ba in the illumination optical path realizes a state in which none of the diffractive optical elements 32 is set in the illumination optical path.

In the spatial light modulation unit 3, multi-polar illumination can be implemented where a diffractive optical element for multi-polar illumination (dipolar illumination, quadrupolar illumination, octupolar illumination, etc.) is set in the illumination optical path, instead of the diffractive optical element for annular illumination. The diffractive optical element for multi-polar illumination has such a function that, with incidence of a parallel beam with a rectangular cross section, it forms a light intensity distribution of a multi-polar (dipolar, quadrupolar, octupolar, etc.) shape in the far field. Therefore, beams through the diffractive optical element for multi-polar illumination form an illumination field of a multi-polar shape, for example, consisting of a plurality of illumination areas of a predetermined shape (an arcuate shape, a circular shape, or the like) around the optical axis AX, on the entrance plane of the micro fly's eye lens 5. As a consequence, the pupil intensity distribution of the same multi-polar shape as the illumination field formed on the entrance plane is also formed on the illumination pupil at or near the rear focal plane of the micro fly's eye lens 5.

Furthermore, ordinary circular illumination can be implemented by setting a diffractive optical element for circular illumination in the illumination optical path, instead of the diffractive optical element for annular illumination. The diffractive optical element for circular illumination has such a function that, with incidence of a parallel beam having a rectangular cross section, it forms a circular light intensity distribution in the far field. Therefore, a beam through the diffractive optical element for circular illumination forms, for example, an illumination field of a circular shape around the optical axis AX, on the entrance plane of the micro fly's eye lens 5. As a consequence, the pupil intensity distribution of the same circular shape as the illumination field formed on the entrance plane is also formed on the illumination pupil at or near the rear focal plane of the micro fly's eye lens 5. Furthermore, modified illumination can also be implemented in various forms by setting a diffractive optical element with a suitable property in the illumination optical path, instead of the diffractive optical element for annular illumination.

When the spatial light modulation unit 3 is in use of the pair of spatial light modulators 34 and 35, the diffractive optical element 32 is retracted from the illumination optical path and the triangular prism 31 and reflecting member 33 are set in the illumination optical path. The triangular prism 31 and reflecting member 33 each have a form of a triangular prism shape extending along the X-direction and are held, for example as shown in FIG. 4, by a frame member 30 having rectangular apertures along the XY plane. Therefore, the triangular prism 31 and reflecting member 33 can be set at their respective predetermined positions in the illumination optical path by moving the frame member 30 in the +X-direction so as to be positioned in the cut 32ba of the rotary plate 32b. When the frame member 30 is moved in the −X-direction from the cut 32ba of the rotary plate 32b, the triangular prism 31 and the reflecting member 33 can be retracted from the illumination optical path.

In a state in which the triangular prism 31 and reflecting member 33 are set at the respective predetermined positions in the illumination optical path, as shown in FIG. 2, the light traveling along the optical axis AX into the triangular prism 31 is divided into a first beam traveling along a first split path defined by an optical axis AX1 and a second beam traveling along a second split path defined by an optical axis AX2. The first beam traveling through the triangular prism 31 and along the first split path passes through one aperture of the frame member 30 to enter the first spatial light modulator 34. The light modulated by the first spatial light modulator 34 is then reflected by a first reflecting surface 33a of the reflecting member 33 to be guided to the relay optical system 4.

On the other hand, the second beam traveling through the triangular prism 31 and along the second split path passes through the other aperture of the frame member 30 to enter the second spatial light modulator 35. The light modulated by the second spatial light modulator 35 is reflected by a second reflecting surface 33b of the reflecting member 33 to be guided to the relay optical system 4. It is assumed below, for simplicity of description, that the first spatial light modulator 34 and the second spatial light modulator 35 have the same configuration and are arranged in symmetry with respect to a plane parallel to the XY plane, including the optical axis AX. Therefore, redundant description with the first spatial light modulator 34 will be omitted for the second spatial light modulator 35 and the action of the spatial light modulators 34, 35 in the spatial light modulation unit 3 will be described with focus on the first spatial light modulator 34.

Figure 5:
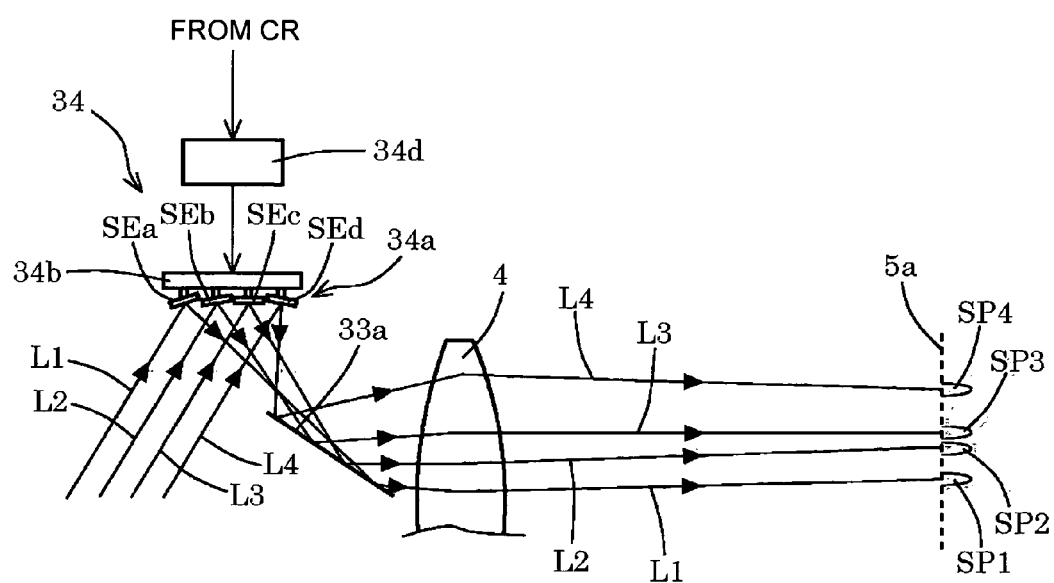
FIG. 5 is an exemplary drawing illustrating the action of spatial light modulators in the spatial light modulation unit.

The first spatial light modulator 34, as shown in FIGS. 2 and 5, is provided with a plurality of mirror elements 34a arrayed two-dimensionally, a base 34b holding the plurality of mirror elements 34a, a cover glass (cover substrate; the illustration of which is omitted in FIG. 5) 34c covering the plurality of mirror elements 34a, and a drive unit 34d which individually controls and drives postures of the plurality of mirror elements 34a through a cable (not shown) connected to the base 34b. In FIG. 5, for clarity of the drawing, the angle of incidence of light to the first reflecting surface 33a is set considerably larger than the angle of incidence in FIG. 2.

Figure 6:
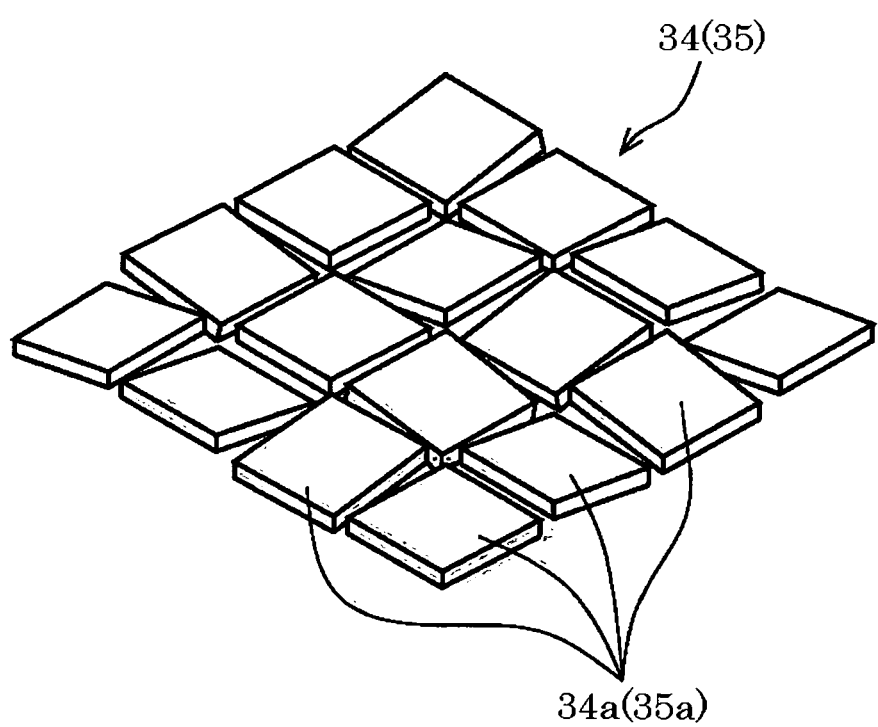
FIG. 6 is a partial perspective view of a spatial light modulator.

The spatial light modulator 34, as shown in FIG. 6, is provided with a plurality of microscopic mirror elements (optical elements) 34a arrayed two-dimensionally, and variably imparts spatial modulations according to incidence positions of incident beams, to the beams incident along the first split path. For simplicity of the description and illustration, FIGS. 5 and 6 show the configuration example wherein the spatial light modulator 34 consists of 4×4=16 mirror elements 34a, but in fact it consists of many more mirror elements 34a than the sixteen elements.

With reference to FIG. 5, among a group of rays incident along directions parallel to the optical axis AX1 onto the spatial light modulator 34, a ray L1 is incident to a mirror element SEa out of the plurality of mirror elements 34a, and a ray L2 is incident to a mirror element SEb different from the mirror element SEa. Likewise, a ray L3 is incident to a mirror element SEc different from the mirror elements SEa, SEb, and a ray L4 is incident to a mirror element SEd different from the mirror elements SEa-SEc. The mirror elements SEa-SEd impart their respective spatial modulations set according to their positions, to the rays L1-L4.

The spatial light modulator 34 is configured as follows: in a normal state where the reflecting faces of all the mirror elements 34a are set along one plane (which will be referred to hereinafter as "standard state"), the rays incident along the directions parallel to the optical axis AX1 are reflected by the spatial light modulator 34 and thereafter reflected into directions approximately parallel to the optical axis AX by the first reflecting surface 33a. The plane where the plurality of mirror elements 34a of the spatial light modulator 34 are arrayed is positioned at or near the front focal position of the relay optical system 4.

Therefore, beams with a predetermined angle distribution as reflected by the plurality of mirror elements SEa-SEd of the spatial light modulator 34 form predetermined light intensity distributions SP1-SP4 on the entrance plane 5a of the micro fly's eye lens 5. Namely, the relay optical system 4 converts angles given to the outgoing beams by the plurality of mirror elements SEa-SEd of the spatial light modulator 34, to positions on the plane 5a which is the far field region (Fraunhofer diffraction region) of the spatial light modulator 34.

Similarly, beams with a predetermined angle distribution as reflected by the plurality of mirror elements of the spatial light modulator 35 also form a predetermined light intensity distribution on the entrance plane 5a of the micro fly's eye lens 5. In this way, the light intensity distribution (pupil intensity distribution) of the secondary light source formed by the micro fly's eye lens 5 becomes a composite distribution of the first light intensity distribution formed on the entrance plane 5a by the first spatial light modulator 34 and relay optical system 4 and the second light intensity distribution formed on the entrance plane 5a by the second spatial light modulator 35 and relay optical system 4.

The spatial light modulator 34 (35), as shown in FIG. 6, is a movable multi-mirror arrangement including the mirror elements 34a (35a) being a large number of microscopic reflecting elements arrayed regularly and two-dimensionally along one plane with the planar reflecting faces thereof at the top. Each mirror element 34a (35a) is movable and the inclination of the reflecting face thereof, which is an inclination angle and inclination direction of the reflecting face, is individually controlled by action of the drive unit 34d (35d) which operates in accordance with a command from a controller CR. Each mirror element 34a (35a) can rotate continuously or discretely by a desired rotation angle around axes of rotation along two directions parallel to the reflecting face thereof and perpendicular to each other. Namely, the inclination of the reflecting face of each mirror element 34a (35a) can be two-dimensionally controlled.

When the reflecting face of each mirror element 34a (35a) is discretely rotated, a preferred control method is to control switch of the rotation angle in a plurality of stages (e.g., . . . , $-2.5°, -2.0°, \ldots, 0°, +0.5°, \ldots, +2.5°, \ldots$ ). FIG. 6 shows the mirror elements 34a (35a) with the contour of square shape, but it should be noted that the contour of the mirror elements 34a (35a) is not limited to the square shape. In terms of light utilization efficiency, however, the contour can be any shape permitting the array of mirror elements 34a (35a) to minimize a clearance (shape permitting close packing). Furthermore, in terms of light utilization efficiency, a gap between two adjacent mirror elements 34a (35a) can be reduced to a requisite minimum level.

The first embodiment employs as the spatial light modulators 34, 35, for example, spatial light modulators configured to continuously vary orientations of the mirror elements 34a (35a) arrayed two-dimensionally. The spatial light modulators of this type applicable herein are, for example, those disclosed in European Patent Laid-Open No. 779530, U.S. Pat. No. 6,900,915, U.S. Pat. No. 7,095,546, and Japanese Patent Application Laid-Open No. 2006-113437. The orientations of the mirror elements 34a (35a) arrayed two-dimensionally may also be controlled so as to have a plurality of discrete stages.

Figure 7:
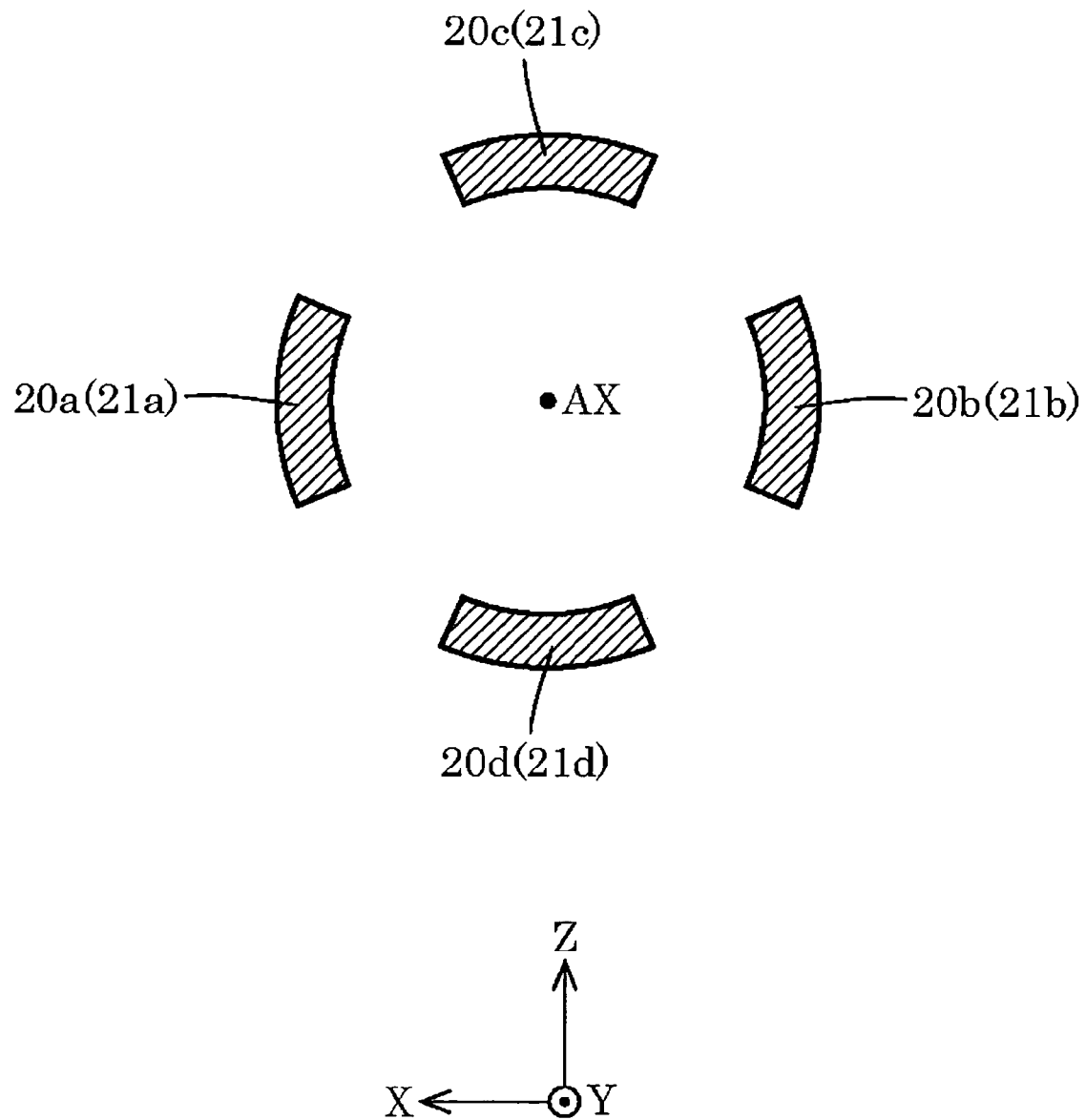
FIG. 7 is an exemplary drawing schematically showing a light intensity distribution of a quadrupolar shape formed on an entrance plane and a rear focal plane of a micro fly's eye lens.

In this manner, in the first spatial light modulator 34 the postures of the mirror elements 34a each are changed by the action of the drive unit 34d operating in accordance with a control signal from the controller CR, whereby each mirror element 34a is set in a predetermined orientation. The beams reflected at respective predetermined angles by the plurality of mirror elements 34a of the first spatial light modulator 34 form, for example, two circular light intensity distributions 20a and 20b spaced in the X-direction around the optical axis AX, on the entrance plane 5a of the micro fly's eye lens 5, as shown in FIG. 7.

Similarly, in the second spatial light modulator 35, the postures of the mirror elements 35a each are changed by the action of the drive unit 35b operating in accordance with a control signal from the controller CR, whereby each mirror element 35a is set in a predetermined orientation. The beams reflected at respective predetermined angles by the plurality of mirror elements 35a of the second spatial light modulator 35 form, for example, two circular light intensity distributions 20c and 20d spaced in the Z-direction around the optical axis AX, on the entrance plane 5a of the micro fly's eye lens 5, as shown in FIG. 7.

In this way, a quadrupolar light intensity distribution 21a-21d corresponding to the quadrupolar light intensity distribution 20a-20d is formed on the illumination pupil (position where the aperture stop 6 is arranged) at or near the rear focal plane of the micro fly's eye lens 5. Furthermore, a quadrupolar light intensity distribution corresponding to the quadrupolar light intensity distribution 20a-20d is also formed at any other illumination pupil position optically conjugate with the aperture stop 6, i.e., at the pupil position of the imaging optical system 9 and at the pupil position of the projection optical system PL (the position where the aperture stop AS is arranged).

The exposure apparatus of the first embodiment is provided with a pupil intensity distribution measuring device 10 which measures the pupil intensity distribution on the pupil plane of the projection optical system PL on the basis of the light having traveled through the projection optical system PL. The measuring device (measuring unit) 10 is provided, for example, with a CCD imaging unit having an image pickup surface arranged at a position optically conjugate with the pupil position of the projection optical system PL, and monitors a pupil intensity distribution about each point on the image plane of the projection optical system PL (i.e., a pupil intensity distribution formed on the pupil plane of the projection optical system PL by rays incident to each point). The measurement result by the measuring device 10 is supplied to the controller CR. For the detailed configuration and action of the measuring device 10, reference can be made, for example, to U.S. Patent Application Laid-Open No. 2008/0030707.

In the exposure apparatus, it is important to perform exposure under an appropriate illumination condition according to a pattern characteristic, in order to highly accurately and faithfully transfer the pattern of the mask M to the wafer W. The first embodiment has the plurality of diffractive optical elements 32 which have the mutually different properties and which can be selectively set in the illumination optical path, as a means for stationarily forming the light intensity distribution on the illumination pupil. Therefore, the pupil intensity distribution (and, therefore, the illumination condition) can be discretely changed by setting one diffractive optical element 32 selected from the diffractive optical element for annular illumination which stationarily forms the annular pupil intensity distribution, the diffractive optical elements for multi-polar illumination which stationarily form the multi-polar pupil intensity distributions, etc., in the illumination optical path.

Furthermore, the first embodiment has the pair of spatial light modulators 34, 35 in which the postures of the respective mirror elements 34a, 35a each are individually changed, as a means for variably forming the light intensity distribution on the illumination pupil. It is therefore feasible to freely and quickly change the first light intensity distribution formed on the illumination pupil by the action of the first spatial light modulator 34 and the second light intensity distribution formed on the illumination pupil by the action of the second spatial light modulator 35. Namely, it is feasible to freely and quickly change the pupil intensity distribution consisting of the first light intensity distribution formed on the illumination pupil by the action of the first spatial light modulator 34 and the second light intensity distribution formed on the illumination pupil by the action of the second spatial light modulator 35.

For example, the quadrupolar pupil intensity distribution formed on the illumination pupil at or near the rear focal plane of the micro fly's eye lens 5 (which will also be referred to simply as "illumination pupil") by the diffractive optical element for quadrupolar illumination (or by the pair of spatial light modulators 34, 35) has a pair of surface illuminants 21a and 21b spaced in the X-direction with the optical axis AX in between, and a pair of arcuate substantial surface illuminants 21c and 21d spaced in the Z-direction with the optical axis AX in between, as shown in FIG. 7. The X-direction on the illumination pupil herein is the short-side direction of the rectangular microscopic lenses of the micro fly's eye lens 5 and corresponds to the scanning direction of the wafer W. The Z-direction on the illumination pupil is the long-side direction of the rectangular microscopic lenses of the micro fly's eye lens 5 and corresponds to the orthogonal-to-scan direction (Y-direction on the wafer W) orthogonal to the scanning direction of the wafer W.

A rectangular still exposure region ER having long sides along the Y-direction and short sides along the X-direction is formed on the wafer W, as shown in FIG. 8, and a rectangular illumination region (not shown) is formed on the mask M so as to correspond to this still exposure region ER. Here, the quadrupolar pupil intensity distribution formed on the illumination pupil by beams incident to a point in the still exposure region ER has much the same shape, independent of the position of the incident point. However, light intensities of the respective surface illuminants constituting the quadrupolar pupil intensity distribution tend to differ depending upon the position of the incident point.

Specifically, in the case of the quadrupolar pupil intensity distribution formed by light incident to a center point P1 in the still exposure region ER, the light intensity of the pair of surface illuminants spaced in the Z-direction tends to become larger than that of the pair of surface illuminants spaced in the X-direction. On the other hand, in the case of the quadrupolar pupil intensity distribution formed by light incident to peripheral points P2, P3 separated in the Y-direction from the center point P1 in the still exposure region ER, the light intensity of the pair of surface illuminants spaced in the Z-direction tends to become smaller than that of the pair of surface illuminants spaced in the X-direction.

Figure 9A:
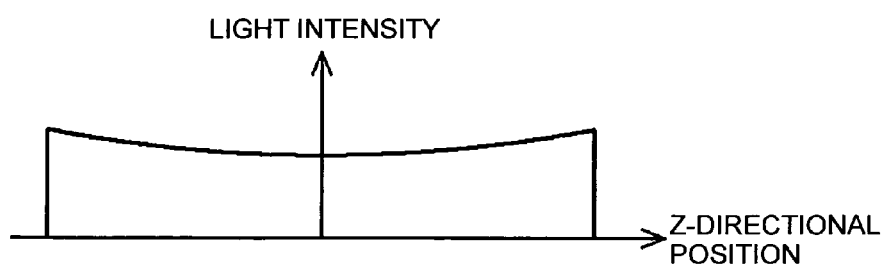
FIG. 9A is an exemplary drawing schematically showing a light intensity distribution along the Z-direction of a pupil intensity distribution about a center point P1 on a wafer.
Figure 9B:
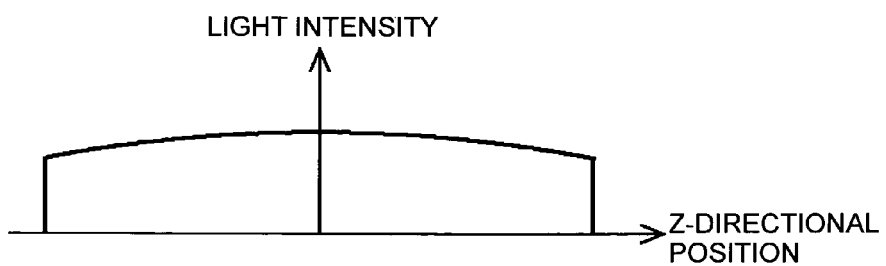
FIG. 9B is an exemplary drawing schematically showing a light intensity distribution along the Z-direction of pupil intensity distributions about peripheral points P2, P3 on a wafer.

In general, regardless of the contour of the pupil intensity distribution formed on the illumination pupil, the light intensity distribution along the Z-direction of the pupil intensity distribution about the center point P1 in the still exposure region ER on the wafer W (i.e., the pupil intensity distribution formed on the illumination pupil by light incident to the center point P1) has a concavely curved distribution increasing toward the periphery from the minimum at the center, as shown in FIG. 9A. On the other hand, the light intensity distribution along the Z-direction of the pupil intensity distribution about the peripheral points P2, P3 in the still exposure region ER on the wafer W has a convexly curved distribution decreasing toward the periphery from the maximum at the center, as shown in FIG. 9B.

The light intensity distribution along the Z-direction of the pupil intensity distribution is not so dependent upon the position of the incident point along the X-direction (scanning direction) in the still exposure region ER, but tends to vary depending upon the position of the incident point along the Y-direction (orthogonal-to-scan direction) in the still exposure region ER. In the case where the pupil intensity distributions about the respective points in the still exposure region ER on the wafer W (the pupil intensity distributions formed on the illumination pupil by the beams incident to the respective points) are not substantially uniform as described above, line widths of patterns vary depending upon positions on the wafer W and it is thus infeasible to faithfully transfer the microscopic pattern of the mask M in a desired line width across the entire exposure region on the wafer W.

The first embodiment has the correction unit CM as an adjusting means for substantially uniformly adjusting each of the pupil intensity distributions about the respective points in the still exposure region ER on the wafer W. In the correction unit CM of the first embodiment, as shown in FIG. 1, the light having traveled through the micro fly's eye lens 5 is reflected and guided into the split optical path by the beam splitter 11 to enter the spatial light modulator 12. The light having traveled via the spatial light modulator 12 is successively reflected by the plane mirror 13 and the beam splitter 14 to return to the illumination optical path and then travels through the condenser optical system 7 to reach the mask blind 8.

The spatial light modulator 12 has the same configuration as the spatial light modulators 34, 35 in the spatial light modulation unit 3. Specifically, the spatial light modulator 12 is provided with a plurality of mirror elements (optical elements) 12a arrayed two-dimensionally, a base 12b holding the plurality of mirror elements 12a, a cover glass 12c covering the plurality of mirror elements 12a, and a drive unit 12d which individually controls and drives the postures of the mirror elements 12a through a cable (not shown) connected to the base 12b. Then the spatial light modulator 12 variably imparts spatial modulations according to incidence positions of incident beams to the incident beams along the split optical path and emits the spatially modulated beams.

Specifically, the spatial light modulator 12, similar to the spatial light modulators 34, 35, is a movable multi-mirror arrangement including a large number of mirror elements 12a of microscopic reflecting elements arrayed regularly and two-dimensionally along one plane with their planar reflecting faces at the top. Each mirror element 12a is movable and the inclination of its reflecting face, which is an inclination angle and inclination direction of the reflecting face, is individually controlled by action of the drive unit 12d which operates in accordance with a command from the controller CR. Each mirror element 12a can rotate continuously or discretely by a desired rotation angle around axes of rotation along two directions parallel to the reflecting face and perpendicular to each other. Namely, the inclination of the reflecting face of each mirror element 12a can be two-dimensionally controlled.

The correction unit CM is configured in such a manner that in the standard state in which the reflecting faces of all the mirror elements 12a of the spatial light modulator 12 are set along one plane, rays incident along directions parallel to the optical axis AX to the beam splitter 11 are reflected by the spatial light modulator 12 and thereafter travel via the plane mirror 13 and beam splitter 14 into directions parallel to the optical axis AX. The plane where the plurality of mirror elements 12a of the spatial light modulator 12 are arrayed is positioned at or near the front focal position of the condenser optical system 7. In other words, the plane where the plurality of mirror elements 12a of the spatial light modulator 12 are arrayed is arranged at a position optically conjugate with the illumination pupil at or near the rear focal plane of the micro fly's eye lens 5, or at a position near the optically conjugate position.

Therefore, the beams with a predetermined angle distribution as reflected by the plurality of mirror elements 12a of the spatial light modulator 12 travel via the plane mirror 13, beam splitter 14, and condenser optical system 7 to form a predetermined light intensity distribution (illumination field) at the position of the mask blind 8. Namely, the condenser optical system 7 converts angles given to the outgoing beams by the plurality of mirror elements 12a of the spatial light modulator 12, to positions on the plane of the aperture of the mask blind 8 being the far field region (Fraunhofer diffraction region) of the spatial light modulator 12.

Figure 10:
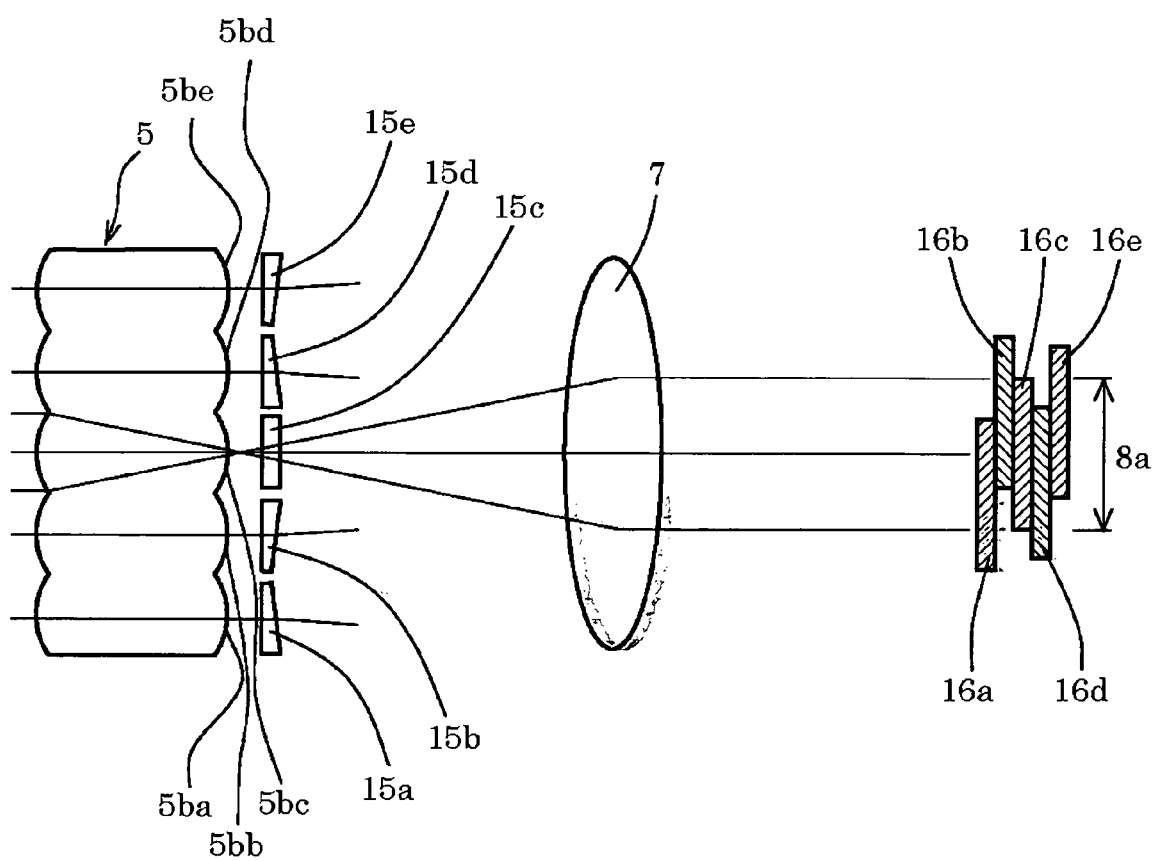
FIG. 10 is an exemplary drawing showing a simplified model for explaining the principle of the present invention.

Now, let us consider a simplified model as shown in FIG. 10, in order to explain the principle of the present embodiment. In the simplified model of FIG. 10, the micro fly's eye lens 5 has five exit-side microscopic refracting faces 5ba, 5bb, 5bc, 5bd, and 5be along the longitudinal direction (Z-direction) of the microscopic refracting faces being its unit wavefront division faces. Angle-deviating prism elements 15a, 15b, 15c, 15d, and 15e are arranged immediately behind the microscopic refracting faces 5ba-5be, respectively. This state corresponds to a state in which one mirror element 12a of the spatial light modulator 12 is arranged for each microscopic refracting face of the micro fly's eye lens 5. However, the direction of emission of light varies continuously or discretely in the case of the mirror elements 12a, whereas the direction of emission of light is fixed in the case of the angle-deviating prism elements 15a-15e.

In this case, angle variations given to outgoing beams by the angle-deviating prism elements 15a-15e are converted to position variations of illumination fields formed at the position of the mask blind 8 (position optically conjugate with the mask M or the wafer W being the illumination target surface) by beams having traveled via the angle-deviating prism elements 15a-15e. Specifically, in FIG. 10, a beam having traveled through the center microscopic refracting face 5bc forms an illumination field 16c at the position of the mask blind 8, without being subjected to any angle variation by the corresponding angle-deviating prism element 15c. As a result, the illumination field 16c is formed without any positional change (shift) in the Z-direction with respect to the aperture 8a of the mask blind 8.

Beams having traveled through the microscopic refracting faces 5bb and 5be are subjected to an upward angle variation in the drawing by the angle-deviating prism elements 15b and 15e, respectively, to form illumination fields 16b and 16e at the position of the mask blind 8. As a result, the illumination fields 16b and 16e are formed with a shift in the +Z-direction with respect to the aperture 8a by a distance according to the angle variation given to the outgoing beams by the angle-deviating prism elements 15b and 15e. Similarly, beams having traveled through the microscopic refracting faces 5ba and 5bb are subjected to a downward angle variation in the drawing by the angle-deviating prism elements 15a and 15d, respectively, to form illumination fields 16a and 16d at the position of the mask blind 8. As a result, the illumination fields 16a and 16d are formed with a shift in the −Z-direction with respect to the aperture 8a by a distance according to the angle variation given to the outgoing beams by the angle-deviating prism elements 15a and 15d.

In FIG. 10, it is assumed that the light intensity distributions in the respective illumination fields 16a-16e each are uniform (homogeneous) and that their light intensities are equal to each other, and the illumination fields 16a-16e are shown in a rectangular shape of the same shape. In the example schematically shown in FIG. 10, the light having traveled through the microscopic refracting face 5bc and the angle-deviating prism element 15c is not blocked by the mask blind 8 and thus contributes to illumination of the pattern surface of the mask M being the illumination target surface (and therefore to illumination of the exposure surface of the wafer W). However, the light having traveled through the other microscopic refracting faces and corresponding angle-deviating prism elements is blocked in part by the mask blind 8 and the blocked part does not contribute to illumination of the mask M.

In this manner, part of the light having traveled through the angle-deviating prism elements (and therefore part of the light having traveled via the mirror elements 12a) is blocked by the mask blind 8 and thus does not contribute to the illumination of the mask M. Furthermore, according to an angle change given to an outgoing beam by an angle-deviating prism element (and therefore an angle variation given to an outgoing beam by a mirror element 12a), the position where the beam is incident to the plane of the aperture 8a varies from the original position (the position of incidence in the absence of the correction unit CM and therefore in the absence of the angle-deviating prism element).

That part of light subjected to an angle variation does not contribute to illumination and that the position of incidence on the plane of the aperture 8a varies from the original position mean that the pupil intensity distributions about respective points on the plane of the aperture 8a vary and therefore that the pupil intensity distributions formed at the pupil position of the imaging optical system 9 and at the pupil position of the projection optical system PL by beams having passed through respective points on the plane of the aperture 8a vary. This point will be readily understood in view of the below description with reference to FIGS. 11A-11B and 12A-12B. However, the light intensity distribution formed on the plane of the aperture 8a of the mask blind 8 varies according to the angular variations given to the outgoing beams by the angle-deviating prism elements (and therefore the angle variations given to the outgoing beams by the mirror elements 12a), and thus illuminance unevenness is made on the mask M (and therefore on the wafer W).

Figure 11A:
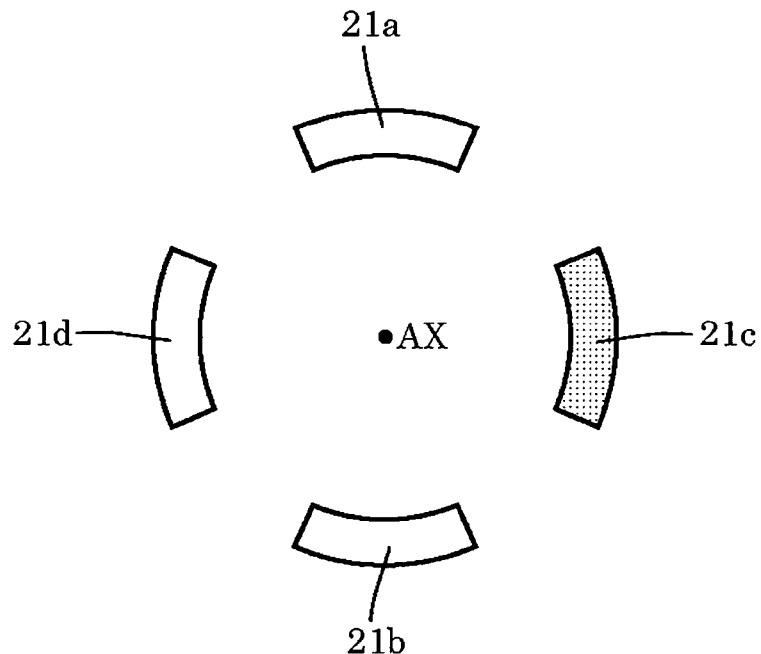
FIGS. 11A and 11B are exemplary drawings showing another simplified model for explaining the action of a correction unit.
Figure 11B:
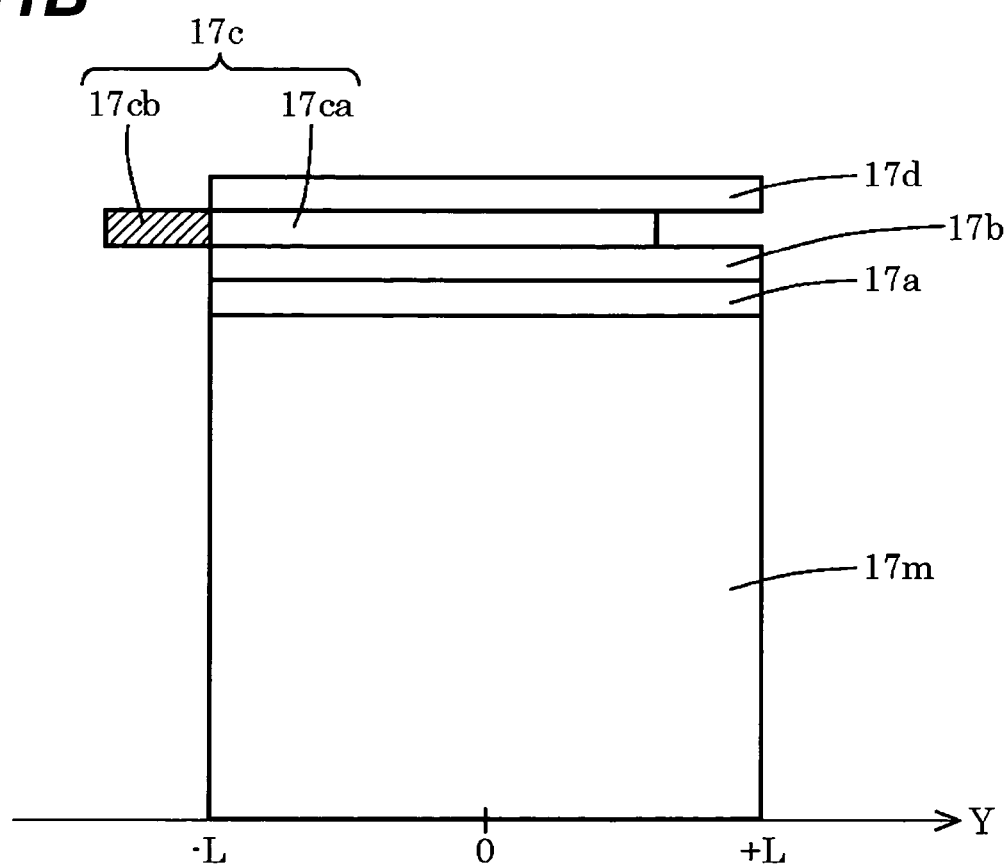

The following will describe the action of the correction unit CM and thus the action of the spatial light modulator 12, with reference to other simplified models as shown in FIGS. 11A-11B and 12A-12B. FIGS. 11A and 11B schematically show a light intensity distribution (illumination field) formed in the still exposure region ER on the wafer W with the length of 2×L along the Y-direction, where a mirror element 12a acts on each of beams from the respective surface illuminants 21a-21d in the quadrupolar pupil intensity distribution formed on the illumination pupil. In the simplified model shown in FIGS. 11A and 11B, the mirror elements 12a acting on the beams from the surface illuminants 21a, 21b, and 21d are in the standard state, but the mirror element 12a acting on the beam from the surface illuminant 21c is not in the standard state.

In this case, the majority of the beams from the quadrupolar pupil intensity distribution 21a-21d passes through the pair of beam splitters 11 and 14 to form, for example, an illumination field 17m with a uniform light intensity distribution in the still exposure region ER. Of the beams from the surface illuminants 21a, 21b, and 21d, beams reflected by the beam splitter 11 travel via the mirror elements 12a in the standard state to form, for example, illumination fields 17a, 17b, and 17d with a uniform light intensity distribution in the still exposure region ER. Of the beam from the surface illuminant 21c, a beam reflected by the beam splitter 11 is subjected to an angle variation by the mirror element 12a which is not in the standard state, to form, for example, an illumination field 17c with a uniform light intensity in the still exposure region ER.

Since the associated beams do not pass through the correction unit CM, the illumination field 17m is formed without a shift in the Y-direction (corresponding to the Z-direction on the illumination pupil) with respect to the still exposure region ER. Although the associated beams are guided to the correction unit CM, the illumination fields 17a, 17b, and 17d are formed without a shift in the Y-direction with respect to the still exposure region ER because the corresponding mirror elements 12a are in the standard state. Since the associated beam is subjected to an angle variation via the mirror element 12a which is not in the standard state, the illumination field 17c is formed, for example, with a shift in the −Y-direction with respect to the still exposure region ER. Namely, the illumination field 17c consists of an illumination field portion 17ca formed inside the still exposure region ER and an illumination field portion 17cb formed outside the still exposure region ER.

Namely, the light having traveled via the correction unit CM out of the beam from the surface illuminant 21c reaches the point of Y-coordinate −L and the point of Y-coordinate 0 in the still exposure region ER, but does not reach the point of Y-coordinate +L. On the other hand, the light having traveled via the correction unit CM out of the beams from the illumination fields 17a, 17b, 17d reaches all the points on the still exposure region ER including the point of Y-coordinate +L. Therefore, assuming that the light intensity of the illumination field formed on the still exposure region ER in the absence of the correction unit CM is 100%, that the light intensity of the illumination field 17m is 90%, and that the light intensity of each illumination field 17a-17d is 2.5%, the light intensity of the surface illuminant 21c in the pupil intensity distribution about the point of Y-coordinate +L will be lowered by 2.5%.

Figure 12A:
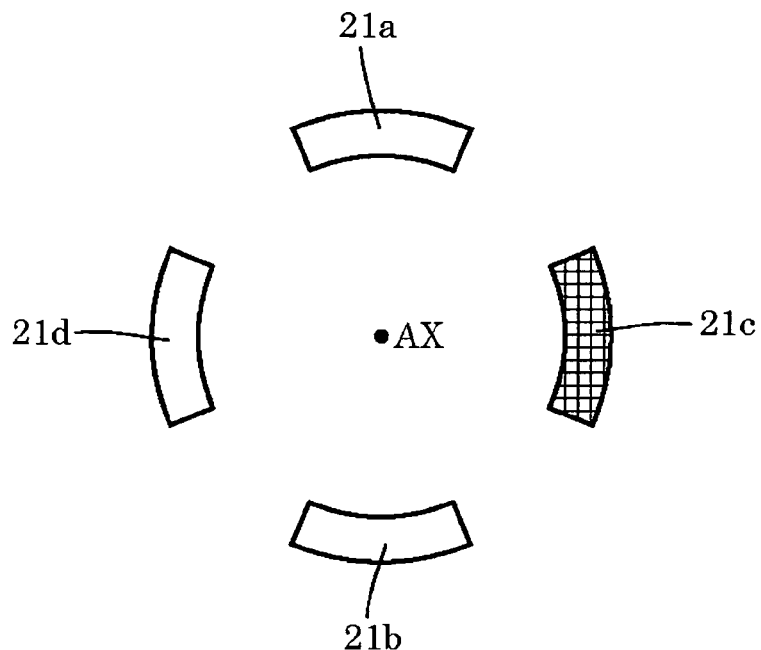
FIGS. 12A and 12B are exemplary drawings showing still another simplified model for explaining the action of the correction unit.
Figure 12B:
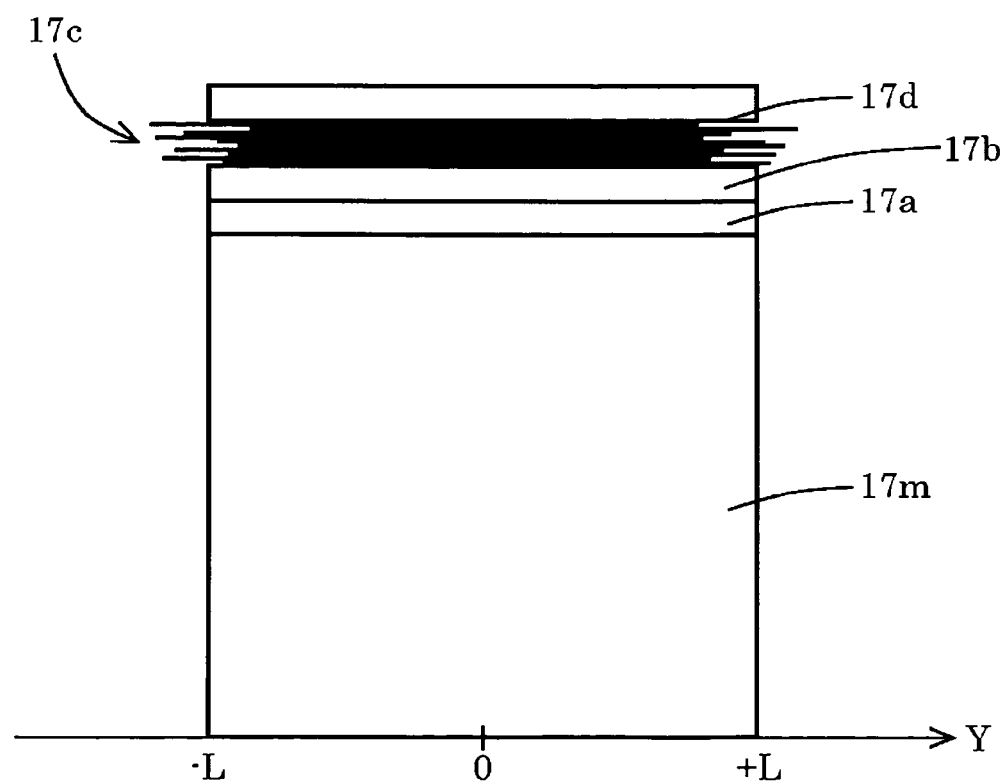

In fact, the reflecting faces of the mirror elements 12a in the spatial light modulator 12 are much smaller than the microscopic refracting faces of the micro fly's eye lens 5, and it is possible to let, for example, several ten thousand to several hundred thousand mirror elements 12a act on the light from each surface illuminant 21a-21d in the quadrupolar pupil intensity distribution formed on the illumination pupil. In FIGS. 12A and 12B, for clarity of the drawing, it is assumed that ten mirror elements 12a act on the beam from the surface illuminant 21c, and ten illumination fields 17c formed by beams having traveled via the respective mirror elements 12a are indicated by ten line segments extending horizontally in the drawing. These line segments each are shifted in the Y-direction according to angle variations given to the outgoing beams by the respective mirror elements 12a.

It is understood with reference to FIGS. 12A and 12B that when a large number of mirror elements 12a act on the beam from the surface illuminant 21c, the light intensity of the surface illuminant 21c in pupil intensity distributions about respective points along the Y-coordinates can be adjusted with high freedom by individually controlling the postures of these mirror elements 12a. Similarly, it is understood that for the other surface illuminants 21a, 21b, 21d, the light intensity of each surface illuminant 21a, 21b, 21d in pupil intensity distributions about respective points along the Y-coordinates can also be adjusted with high freedom by individually controlling the postures of the large number of corresponding mirror elements 12a.

In the description with reference to FIGS. 10, 11A-11B and 12A-12B, for easier understanding of the action of the correction unit CM (and thus the action of the spatial light modulator 12), the posture of a mirror element 12a is changed in one direction to give a one-directional angle variation to light having traveled via the mirror element 12a. In practice, however, the posture of each mirror element 12a can be varied, for example, in two directions orthogonal to each other, to give a required angle variation in any direction to the outgoing beam from the mirror element 12a. By the action of the spatial light modulator 12, therefore, it is feasible to substantially uniformly adjust each of pupil intensity distributions about respective points along one direction in the still exposure region ER on the wafer W and also to substantially uniformly adjust each of pupil intensity distributions about any points.

In the first embodiment, on the occasion of forming a new pupil intensity distribution by use of the spatial light modulation unit 3, i.e., on the occasion of implementing switch between pupil intensity distributions (and therefore on the occasion of implementing switch between illumination conditions), the pupil intensity distribution measuring device 10 is used to measure the pupil intensity distribution about each point in an image region (region corresponding to the still exposure region ER) of the projection optical system PL. Alternatively, without synchronism with the switch between pupil intensity distributions, the pupil intensity distribution about each point in the image region is measured on an as-needed basis as occasion may demand. Then the controller CR controls the spatial light modulator 12 in the correction unit CM in accordance with the measurement result by the measuring device 10, to substantially uniformly adjust each of the pupil intensity distributions about the respective points in the image region.

In the first embodiment, as described above, the light quantity distribution on the wafer (illumination target surface) W is affected by the adjustment by the spatial light modulator 12 in the correction unit CM. In this case, the illuminance distribution in the still exposure region ER or the shape of the still exposure region (illumination region) ER can be changed by the action of a light quantity distribution adjusting unit having a well-known configuration as occasion may demand. Specifically, the light quantity distribution adjusting unit for changing the illuminance distribution can be one applying the configuration and technique described in U.S. Pat. Nos. 6,771,350 and 6,927,836. The light quantity distribution adjusting unit for changing the shape of the illumination region can be one applying the configuration and technique described in U.S. Patent Application Laid-Open No. 2007/0014112.

As described above, the illumination optical system (2-9) of the first embodiment to illuminate the mask M as an illumination target surface on the basis of the light from the light source 1 is provided with the spatial light modulator 12 as a correction unit which is arranged at or near the position optically conjugate with the illumination pupil and which changes directions of emission of incident beams according to the positions of incidence of the beams. Therefore, each of the pupil intensity distributions about the respective points in the still exposure region ER on the wafer W can be substantially uniformly adjusted by individually controlling the postures of the mirror elements 12a in the spatial light modulator 12. Furthermore, the exposure apparatus (2-WS) of the first embodiment is able to perform excellent exposure under an appropriate illumination condition according to the fine pattern on the mask M and therefore to faithfully transfer the fine pattern of the mask M in a desired line width across the entire exposure region on the wafer W, using the illumination optical system (2-9) which substantially uniformly adjusts each of the pupil intensity distributions at the respective points in the still exposure region ER on the wafer W.

In the first embodiment, part of the light incident along the illumination optical path is reflected by the amplitude division type beam splitter 11 to the spatial light modulator 12 and the part of the light having traveled via the spatial light modulator 12 is guided back to the illumination optical path by the amplitude division type beam splitter 14. However, polarization separation type polarization beam splitters can also be used in place of the amplitude division type beam splitters 11 and 14, while suppressing light quantity loss in the beam splitters.

The first embodiment shows the example where the first light intensity distribution by the first spatial light modulator 34 and the second light intensity distribution by the second spatial light modulator 35 are formed at the different positions on the illumination pupil, but the first light intensity distribution and the second light intensity distribution may overlap in part with each other or may be completely superimposed on each other (i.e., the first light intensity distribution and the second light intensity distribution may be formed in the same distribution and at the same position).

The first embodiment employs the triangular prism 31 as a dividing member for dividing the light incident along the illumination optical path (along the optical axis AX) into two beams traveling in two directions different from each other. However, the number of divisions of light is not limited to 2, but the incident light can also be divided, for example, into three or more beams by means of a diffractive optical element. In general, it is possible to divide the light incident along the illumination optical path into a plurality of beams traveling in a plurality of different directions and also provide the spatial light modulators as many as the divided beams. In the configuration of the embodiment described above, it is also possible to adopt a configuration using only one spatial light modulator 34 out of the pair of spatial light modulators 34, 35. In this case, for example, an angle-deviating prism can be used instead of the triangular prism 31 as a dividing member.

Figure 13:
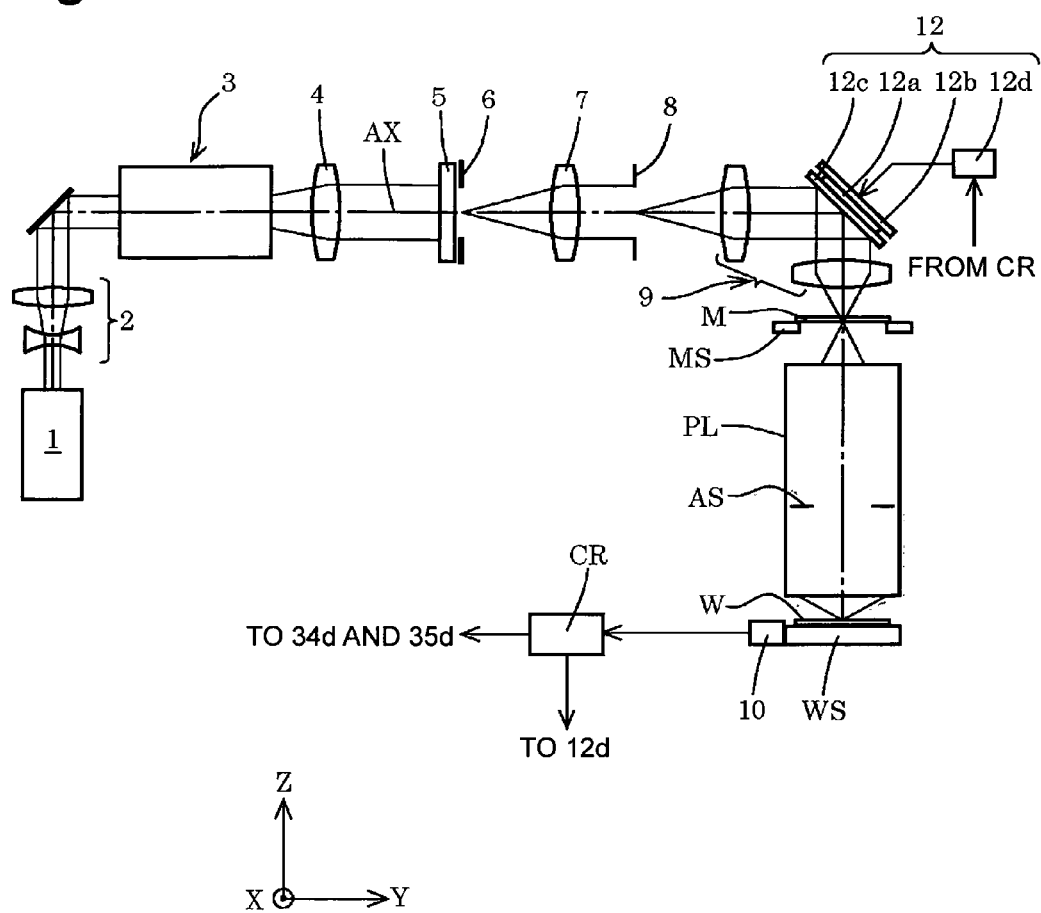
FIG. 13 is an exemplary drawing schematically showing a configuration of an exposure apparatus according to the second embodiment.

In the first embodiment, the spatial light modulator 12 in the correction unit CM is arranged at or near the position optically conjugate with the illumination pupil at or near the rear focal plane of the micro fly's eye lens 5. However, without having to be limited to this, the spatial light modulator 12 as a correction unit may also be located at or near the pupil position of the imaging optical system 9, for example, as shown in the second embodiment of FIG. 13. The second embodiment of FIG. 13 has a configuration similar to the first embodiment of FIG. 1, but is different from the first embodiment in that the spatial light modulator 12 is arranged in the illumination optical path. In FIG. 13, the elements with the same functionality as the components in FIG. 1 are denoted by the same reference signs as in FIG. 1.

As described above, the pupil position of the imaging optical system 9 is the position optically conjugate with the illumination pupil at or near the rear focal plane of the micro fly's eye lens 5, and is the position that can be called an illumination pupil. In the second embodiment of FIG. 13, therefore, the spatial light modulator 12 as a correction unit is arranged at the position of the illumination pupil in the illumination optical path or at a position near it. In the second embodiment, the light from the micro fly's eye lens 5, without being guided into a split optical path, is incident along the illumination optical path to the spatial light modulator 12 and is reflected along the illumination optical path by the spatial light modulator 12. Namely, in the second embodiment, different from the first embodiment in which the target of correction by the spatial light modulator 12 is only the light guided into the split optical path by the beam splitter 11, the target of correction by the spatial light modulator 12 is almost all of the light from the pupil intensity distribution immediately behind the micro fly's eye lens 5.

In each of the above embodiments, where the exposure light is the ArF excimer laser light or KrF excimer laser light or the like, it is necessary to fill the optical path with an inert gas such as nitrogen gas or helium gas which is gas having a low absorptance of the exposure light, or to keep the optical path substantially in a vacuum state. Since each of the embodiments adopts the fixed installation of the spatial light modulators 34, 35 and 12, it is possible to provide a purge wall (not shown) including the cover glass 34c, 35c, or 12c. In this case, the main bodies (portions including the movable portions) of the spatial light modulators 34, 35, 12 are arranged outside an airtight space, so that free operation of the spatial light modulators 34, 35, 12 can be ensured while maintaining good purge.

In each of the above embodiments, the relay optical system 4 as a condensing optical system functioning as a Fourier transform lens is arranged in the optical path between the spatial light modulation unit 3 and the micro fly's eye lens 5. However, without having to be limited to this, it is also possible to arrange an optical system including an afocal optical system, a conical axicon system, a magnification varying optical system, etc., instead of the relay optical system 4. The optical system of this type is disclosed in U.S. Patent Application Laid-Open No. 2006/0170901A.

In the above description, the operational effect of the present embodiment is explained using the modified illumination to form the quadrupolar pupil intensity distribution on the illumination pupil, i.e., the quadrupolar illumination as an example. However, it is clear that, without having to be limited to the quadrupolar illumination, the same operational effect can also be achieved by similarly applying the present embodiment, for example, to the annular illumination to form the annular pupil intensity distribution, the multi-polar illumination to form the pupil intensity distribution of the multi-polar shape other than the quadrupolar shape, and so on.

In the above description, the present embodiment is applied to the exposure apparatus of the step-and-scan method to perform the scanning exposure of the pattern of the mask M in the shot area on the wafer W. However, without having to be limited to this, the present embodiment can also be applied to the exposure apparatus of the step-and-repeat method to repeat the full-shot exposure operation of the pattern of the mask M in each of exposure regions on the wafer W.

In the foregoing description, the spatial light modulators with the plurality of optical elements arrayed two-dimensionally and controlled individually are the spatial light modulators in which the orientations (angles: inclinations) of the reflecting faces arrayed two-dimensionally can be individually controlled. However, without having to be limited to this, it is also possible, for example, to use spatial light modulators in which heights (positions) of a plurality of reflecting faces arrayed two-dimensionally can be individually controlled. The spatial light modulators of this type applicable herein are those disclosed, for example, in U.S. Pat. No. 5,312,513, and in FIG. 1d in U.S. Pat. No. 6,885,493. These spatial light modulators can impart the same action as diffracting faces to incident light by formation of a two-dimensional height distribution. The aforementioned spatial light modulators with the plurality of reflecting faces arrayed two-dimensionally may be modified, for example, according to the disclosures in U.S. Pat. No. 6,891,655 and U.S. Patent Application Laid-Open No. 2005/0095749.

Figure 14:
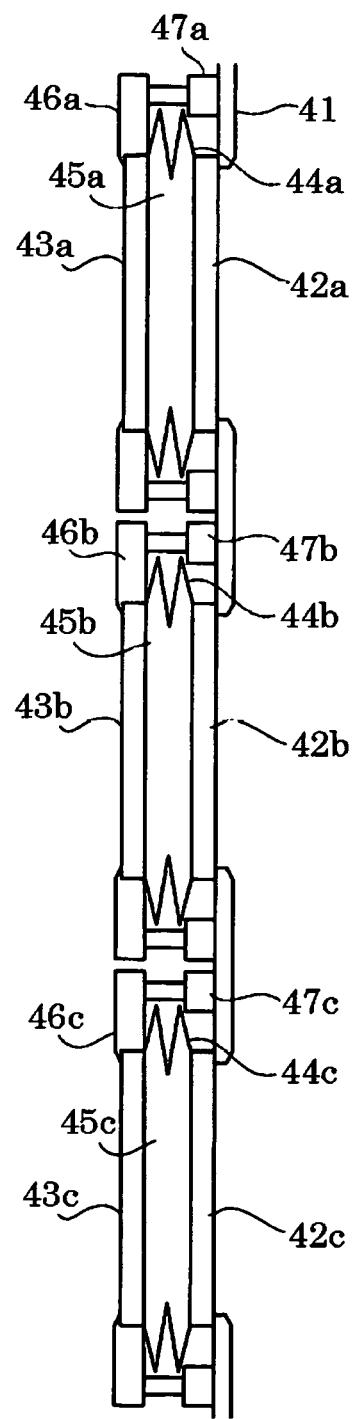
FIG. 14 is an exemplary sectional view of a first configuration example of a correction unit consisting of a transmission type spatial light modulator.
Figure 15:
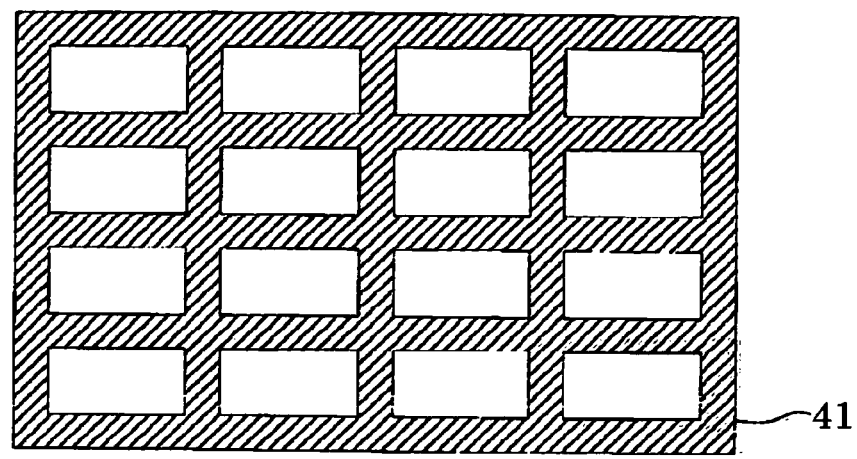
FIG. 15 is an exemplary side view of the correction unit in FIG. 14.

In the foregoing description, the correction unit employs the reflection type spatial light modulator with the plurality of mirror elements, but the correction unit, without having to be limited to this, may employ a transmission type spatial light modulator, for example, disclosed in U.S. Pat. No. 5,229,872. An example of the transmission type spatial light modulator with the plurality of optical elements is a correction unit provided with a plurality of variable angle prisms of a liquid enclosure type, as shown in FIGS. 14 and 15. FIG. 14 is an exemplary sectional view of the correction unit along a plane including the optical axis of the illumination optical system. FIG. 15 is an exemplary right side view in the drawing of the correction unit of FIG. 14.

In FIG. 14, a holding unit 41 holds a plurality of variable angle prisms so that these variable angle prisms (42a-45a, 42b-45b, 42c-45c) are two-dimensionally arrayed. Each variable angle prism is provided with a pair of plane-parallel plates (42a, 43a; 42b, 43b; 42c, 43c), deformable bellows (44a; 44b; 44c) coupling end faces of these paired plane-parallel plates, and an optically transparent liquid filled in a space created by these paired plane-parallel plates and bellows. Of a pair of plane-parallel plates, the plane-parallel plate (43a; 43b; 43c) opposite to the plane-parallel plate (42a; 42b; 42c) held by the holding unit 41 is held by a holding frame (46a; 46b; 46c) and these holding frames are actuated so as to be inclined relative to the holding unit 41 by respective actuators (47a; 47b; 47c). This operation results in changing apex angles between the pair of plane-parallel plates (42a, 43a; 42b, 43b; 42c, 43c), whereby light passing through each variable angle prism is deflected according to the apex angle.

Figure 16:
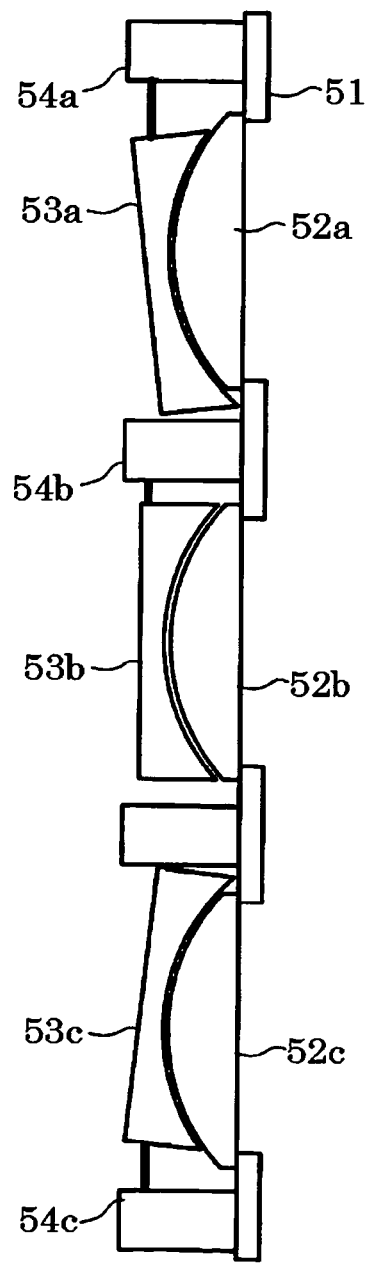
FIG. 16 is an exemplary sectional view of a second configuration example of a correction unit consisting of a transmission type spatial light modulator.
Figure 17:
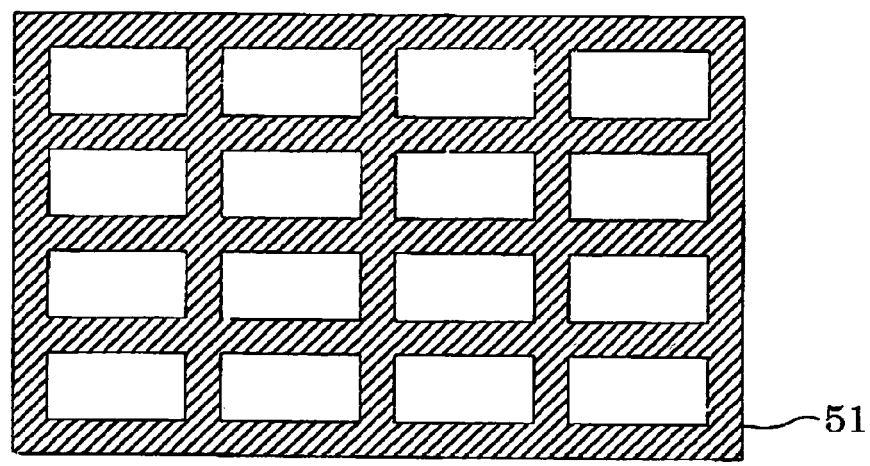
FIG. 17 is an exemplary side view of the correction unit in FIG. 16.

In the example shown in FIGS. 16 and 17, each variable angle prism consists of a combination of a planoconvex lens (52a; 52b; 52c) and a planoconcave lens (53a; 53b; 53c). In this example, each planoconvex lens (52a; 52b; 52c) is fixed to a holding unit 51 and the planoconcave lens (53a; 53b; 53c) is movable in directions along a convex surface of the planoconvex lens. Each planoconcave lens is actuated by an actuator (54a; 54b; 54c). In the example of FIGS. 16 and 17, with change in the apex angle between the planoconvex lens and the planoconcave lens (52a, 53a; 52b, 53b; 52c, 53c), light passing through each variable angle prism is also deflected according to the apex angle. The planoconvex lenses and planoconcave lenses may be cylindrical lenses.

Figure 18:
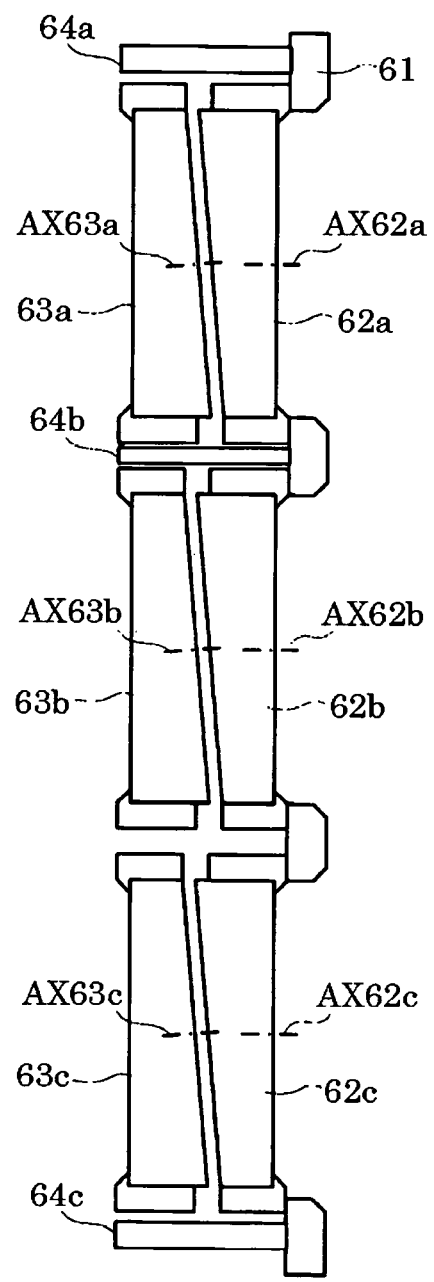
FIG. 18 is an exemplary sectional view of a third configuration example of a correction unit consisting of a transmission type spatial light modulator.
Figure 19:
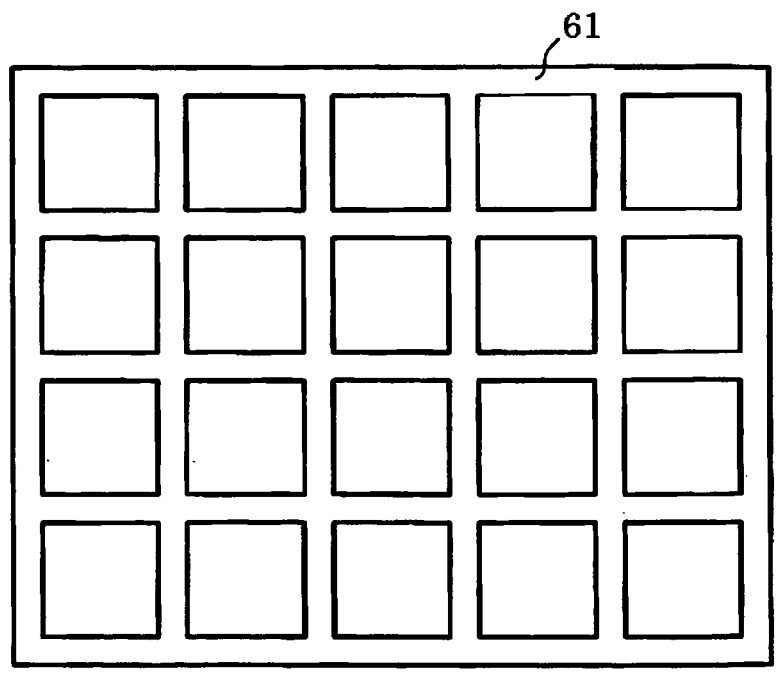
FIG. 19 is an exemplary side view of the correction unit in FIG. 18.

The example shown in FIGS. 18 and 19 is an example in which the correction unit is provided with a plurality of angle-deviating prism pairs. A holding unit 61 holds angle-deviating prisms (62a; 62b; 62c) so as to be rotatable around their respective axes (AX62a; AX62b; AX62c). On the slope side of each angle-deviating prism (62a; 62b; 62c), an angle-deviating prism (63a; 63b; 63c) is arranged which is provided so as to be rotatable around an axis (AX63a; AX63b; AX63c) along a normal direction to a slope thereof. These angle-deviating prisms (63a; 63b; 63c) are rotatable with respect to the corresponding angle-deviating prisms (62a; 62b; 62c).

In the example of FIGS. 18 and 19, the apex angle between the angle-deviating prism pair (62a, 63a; 62b, 63b; 62c, 63c) in the two-dimensional array is changed by rotating the angle-deviating prism (63a; 63b; 63c) around each axis (AX63a; AX63b; AX63c), and a direction of the apex angle (an azimuth around each axis (AX62a; AX62b; AX62c)) is also changed with rotation of the angle-deviating prism (62a; 62b; 62c) around each axis (AX62a; AX62b; AX62c) (with the angle-deviating prism (63a; 63b; 63c) being rotated together). Each of these angle-deviating prisms (62a, 63a; 62b, 63b; 62c, 63c) is rotationally actuated by an actuator (64a; 64b; 64c). In the example of FIGS. 18 and 19, with change in the apex angle of each angle-deviating prism pair, light passing through each angle-deviating prism pair is also deflected according to change in apex angle. Each angle-deviating prism pair (62a, 63a; 62b, 63b; 62c, 63c) can be regarded as a variable angle prism.

Figure 20:
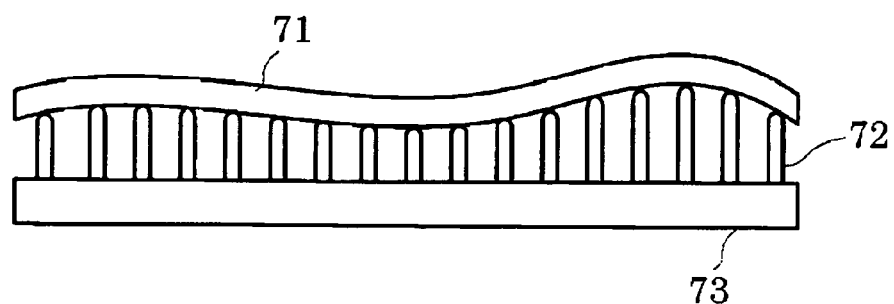
FIG. 20 is an exemplary sectional view of a configuration example of a correction unit having a locally deformable reflecting surface.

In the foregoing description, the correction unit employs the reflection type spatial light modulator with the plurality of mirror elements, but, without having to be limited to this, it is also possible to employ a correction unit with a locally deformable reflecting surface, or a correction unit with a locally deformable refracting surface. An example of the correction unit with a locally deformable reflecting surface applicable herein is a correction unit provided with a deformable mirror, as shown in FIG. 20. The deformable mirror shown in the example of FIG. 20 has a configuration in which a reflecting surface is pushed and pulled on the back side of the reflecting surface 71 by a plurality of actuators 72 arranged in a matrix pattern on a substrate 73, and the shape of the reflecting surface 71 is changed by actuation of each actuator 72.

In the aforementioned embodiments, the mask can be replaced with a variable pattern forming device for forming a predetermined pattern based on predetermined electronic data. Use of this variable pattern forming device minimizes the effect on synchronization accuracy even if the pattern surface is set vertical. The variable pattern forming device can be, for example, a DMD (Digital Micromirror Device) including a plurality of reflective elements driven based on predetermined electronic data. The exposure apparatus with the DMD is disclosed, for example, in Japanese Patent Application Laid-Open No. 2004-304135 and International Publication WO2006/080285. Besides the non-emission type reflective spatial optical modulators like the DMD, it is also possible to use a transmission type spatial optical modulator or a self-emission type image display device.

In the aforementioned embodiments, each of the pupil intensity distributions at the respective points on the illumination target surface was approximately uniformly adjusted, but the pupil intensity distributions at the respective points on the illumination target surface may also be adjusted to a nonuniform predetermined distribution. It is also possible to adjust the pupil intensity distributions at the respective points on the illumination target surface to respective predetermined distributions different from each other. For example, the pupil intensity distributions at the respective points on the illumination target surface may be adjusted to respective predetermined distributions different from each other, in order to correct line width errors caused by factors other than uniformity of the pupil intensity distribution of the exposure apparatus itself, or line width errors caused by devices other than the exposure apparatus, e.g., coating-developing apparatus (coater-developer) and heating/cooling apparatus used in combination with the exposure apparatus in the photolithography process.

In the photolithography process in manufacture of semiconductor devices, as described below, a photoresist (photosensitive material) film is formed on a surface of a processed object such as a wafer, it is then exposed to a circuit pattern, and it is further subjected to a developing process, thereby forming a resist pattern. This photolithography process is carried out by means of the coating-developing apparatus (coater-developer) having a resist coating unit for coating a wafer with a resist, a developing unit for developing the wafer after exposure, etc., and the exposure apparatus integrally provided in succession to the foregoing apparatus.

Such coating-developing apparatus has a heating device and a cooling device for performing a thermal treatment such as a heating process or a cooling process for the wafer, for example, after formation of the resist film on the wafer or, before and after the development process. If the thickness of the resist film is nonuniform in the surface of the wafer or if a temperature distribution in the wafer surface is nonuniform in these thermal treatments, a distribution of line width uniformity in a shot area may demonstrate different properties depending upon positions in the shot area on the wafer W.

In the case of an etching device for etching an etched film lying below the resist pattern, using the aforementioned resist pattern as a mask, the distribution of line width uniformity in a shot area may demonstrate different properties depending upon positions in the shot area on the wafer W if the temperature distribution in the wafer surface is nonuniform.

The variation in distribution of line width uniformity in the shot area depending upon positions in the shot area on the wafer due to such coating-developing apparatus, etching device, etc. has somewhat stable error distribution (systematic error distribution) independent of shot positions in the wafer. In the exposure apparatus of the foregoing embodiments, therefore, the variation in distribution of line width uniformity in the shot area can be corrected by adjusting the pupil intensity distributions at the respective points on the illumination surface to respective predetermined distributions different from each other.

The exposure apparatus of the foregoing embodiments is manufactured by assembling various sub-systems containing their respective components as set forth in the scope of claims in the present application, so as to maintain predetermined mechanical accuracy, electrical accuracy, and optical accuracy. For ensuring these various accuracies, the following adjustments are carried out before and after the assembling: adjustment for achieving the optical accuracy for various optical systems; adjustment for achieving the mechanical accuracy for various mechanical systems; adjustment for achieving the electrical accuracy for various electrical systems. The assembling blocks from the various sub-systems into the exposure apparatus include mechanical connections, wire connections of electric circuits, pipe connections of pneumatic circuits, etc. between the various sub-systems. It is needless to mention that there are assembling blocks of the individual sub-systems, before the assembling blocks from the various sub-systems into the exposure apparatus. After completion of the assembling blocks from the various sub-systems into the exposure apparatus, overall adjustment is carried out to ensure various accuracies as the entire exposure apparatus. The manufacture of exposure apparatus is desirably performed in a clean room in which the temperature, cleanliness, etc. are controlled.

Figure 21:
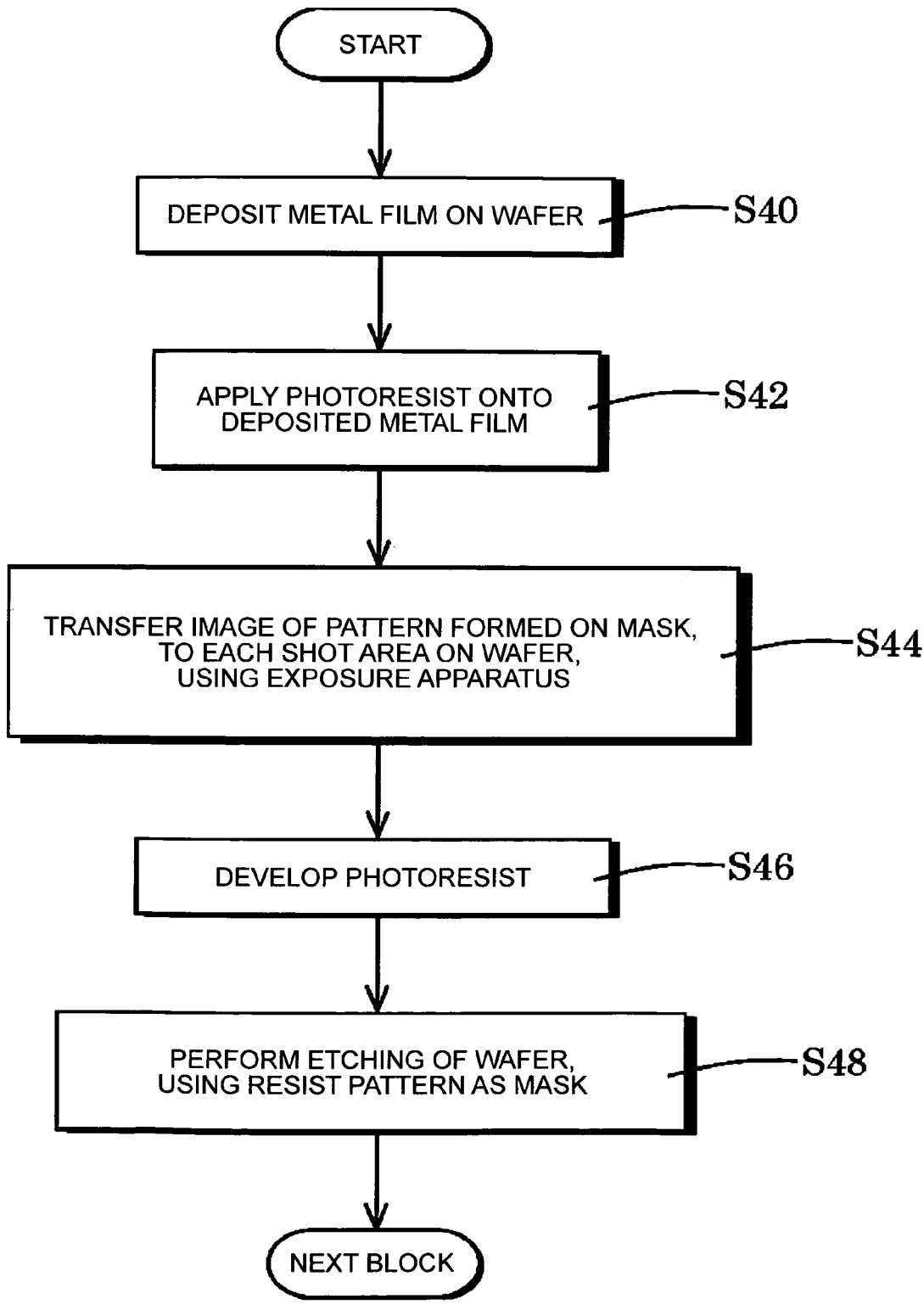
FIG. 21 is an exemplary flowchart showing manufacturing blocks of semiconductor devices.

The following will describe a device manufacturing method using the exposure apparatus according to the above-described embodiments. FIG. 21 is an exemplary flowchart for explaining manufacturing blocks of semiconductor devices. As shown in FIG. 21, the manufacturing blocks of semiconductor devices include depositing a metal film on a wafer W to become a substrate of semiconductor devices (block S40) and applying a photoresist as a photosensitive material onto the deposited metal film (block S42). The subsequent blocks include transferring a pattern formed on a mask (reticle) M, into each shot area on the wafer W, using the projection exposure apparatus of the above embodiments (block S44: exposure block), and developing the wafer W after completion of the transfer, i.e., developing the photoresist to which the pattern has been transferred (block S46: development block).

Thereafter, using the resist pattern made on the surface of the wafer W in block S46, as a mask, processing such as etching is carried out on the surface of the wafer W (block S48: processing block). The resist pattern herein is a photoresist layer in which depressions and projections are formed in a shape corresponding to the pattern transferred by the projection exposure apparatus of the above embodiments and which the depressions penetrate throughout. Block S48 is to process the surface of the wafer W through this resist pattern. The processing carried out in block S48 includes, for example, at least either etching of the surface of the wafer W or deposition of a metal film or the like. In block S44, the projection exposure apparatus of the above embodiments performs the transfer of the pattern onto the wafer W coated with the photoresist, as a photosensitive substrate or plate P.

Figure 22:
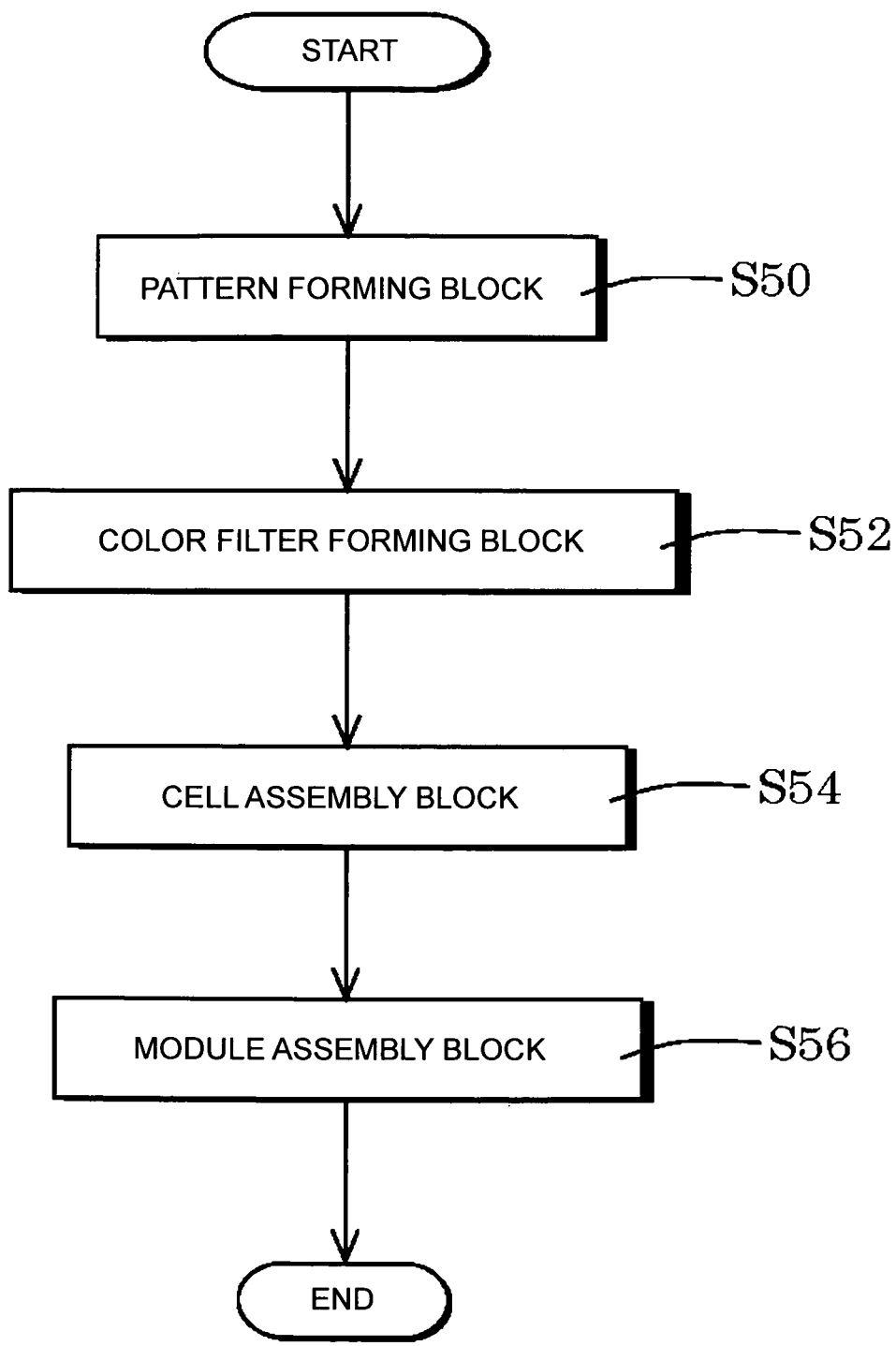
FIG. 22 is an exemplary flowchart showing manufacturing blocks of a liquid crystal device such as a liquid crystal display device.

FIG. 22 is an exemplary flowchart showing manufacturing blocks of a liquid crystal device such as a liquid crystal display device. As shown in FIG. 22, the manufacturing blocks of the liquid crystal device include sequentially performing a pattern forming block (block S50), a color filter forming block (block S52), a cell assembly block (block S54), and a module assembly block (block S56). The pattern forming block of block S50 is to form predetermined patterns such as a circuit pattern and an electrode pattern on a glass substrate coated with a photoresist, as a plate P, using the projection exposure apparatus of the above embodiments. This pattern forming block includes an exposure block of transferring a pattern to a photoresist layer, using the projection exposure apparatus of the above embodiments, a development block of performing development of the plate P with the pattern thereon, i.e., development of the photoresist layer on the glass substrate, to form the photoresist layer in the shape corresponding to the pattern, and a processing block of processing the surface of the glass substrate through the developed photoresist layer.

The color filter forming block of block S52 is to form a color filter in which a large number of sets of three dots corresponding to R (Red), G (Green), and B (Blue) are arrayed in a matrix pattern, or in which a plurality of filter sets of three stripes of R, G, and B are arrayed in a horizontal scan direction. The cell assembly block of block S54 is to assemble a liquid crystal panel (liquid crystal cell), using the glass substrate on which the predetermined pattern has been formed in block S50, and the color filter formed in block S52. Specifically, for example, a liquid crystal is poured into between the glass substrate and the color filter to form the liquid crystal panel. The module assembly block of block S56 is to attach various components such as electric circuits and backlights for display operation of this liquid crystal panel, to the liquid crystal panel assembled in block S54.

The present embodiment is not limited just to the application to the exposure apparatus for manufacture of semiconductor devices, but can also be widely applied, for example, to the exposure apparatus for display devices such as the liquid crystal display devices or plasma displays formed with rectangular glass plates, and to the exposure apparatus for manufacture of various devices such as imaging devices (CCDs and others), micro machines, thin film magnetic heads, and DNA chips. Furthermore, the present embodiment is also applicable to the exposure block (exposure apparatus) for manufacture of masks (photomasks, reticles, etc.) on which mask patterns of various devices are formed, by the photolithography process.

The above-described embodiments use the ArF excimer laser light (wavelength: 193 nm) or the KrF excimer laser light (wavelength: 248 nm) as the exposure light and, without having to be limited to these, the present embodiment can also be applied to any other appropriate laser light source, e.g., an $F_2$ laser light source which supplies laser light at the wavelength of 157 nm. The aforementioned embodiments were the applications of the present embodiment to the illumination optical system to illuminate the mask in the exposure apparatus, but, without having to be limited to this, the present embodiment can also be applied to generally-used illumination optical systems which illuminate an illumination target surface except for the mask.

It will be understood by those skilled in the art that aspects of embodiments of the subject matter disclosed above are intended to satisfy the requirement of disclosing at least one enabling embodiment of the subject matter of each claim and to be one or more such exemplary embodiments only and to not to limit the scope of any of the claims in any way and particularly not to a specific disclosed embodiment alone. Many changes and modification can be made to the disclosed aspects of embodiments of the disclosed subject matter of the claims that will be understood and appreciated by those skilled in the art, particularly in regard to interpretation of the claims for purposes of the doctrine of equivalents. The appended claims are intended in scope and meaning to cover not only the disclosed aspects of embodiments of the claimed subject matter but also such equivalents and other modifications and changes that would be apparent to those skilled in the art. In additions to changes and modifications to the disclosed and claimed aspects of the subject matter disclosed of the disclosed subject matter(s) noted above, others could be implemented.

While the particular aspects of embodiment(s) of the illumination optical system, aligner, and process for fabricating device described and illustrated in this patent application in the detail required to satisfy 35 U.S.C. § 112 is fully capable of attaining any above-described purposes for, problems to be solved by or any other reasons for or objects of the aspects of an embodiment(s) above described, it is to be understood by those skilled in the art that it is the presently described aspects of the described embodiment(s) of the subject matter claimed are merely exemplary, illustrative and representative of the subject matter which is broadly contemplated by the claimed subject matter. The scope of the presently described and claimed aspects of embodiments fully encompasses other embodiments which may now be or may become obvious to those skilled in the art based on the teachings of the Specification. The scope of the present inventions is solely and completely limited by only the appended claims and nothing beyond the recitations of the appended claims. Reference to an element in such claims in the singular is not intended to mean nor shall it mean in interpreting such claim element "one and only one" unless explicitly so stated, but rather "one or more." All structural and functional equivalents to any of the elements of the above-described aspects of an embodiment(s) that are known or later come to be known to those of ordinary skill in the art are expressly incorporated herein by reference and are intended to be encompassed by the present claims. Any term used in the Specification and/or in the claims and expressly given a meaning in the Specification and/or claims in the present application shall have that meaning, regardless of any dictionary or other commonly used meaning for such a term. It is not intended or necessary for a device or method discussed in the Specification as any aspect of an embodiment to address each and every problem sought to be solved by the aspects of embodiments disclosed in this application, for it to be encompassed by the present claims. No element, component, or method step in the present disclosure is intended to be dedicated to the public regardless of whether the element, component, or method step is explicitly recited in the claims. No claim element in the appended claims is to be construed under the provisions of 35 U.S.C. § 112, sixth paragraph, unless the element is expressly recited using the phrase "means for" or, in the case of a method claim, the element is recited as a "step" instead of an "act."

It will be understood also be those skilled in the art that, in fulfillment of the patent statutes of the United States, Applicant(s) has disclosed at least one enabling and working embodiment of each invention recited in any respective claim appended to the Specification in the present application and perhaps in some cases only one. For purposes of cutting down on patent application length and drafting time and making the present patent application more readable to the inventor(s) and others, Applicant(s) has used from time to time or throughout the present application definitive verbs (e.g., "is", "are", "does", "has", "includes" or the like) and/or other definitive verbs (e.g., "produces," "causes" "samples," "reads," "signals" or the like) and/or gerunds (e.g., "producing," "using," "taking," "keeping," "making," "determining," "measuring," "calculating" or the like), in defining an aspect/feature/element of, an action of or functionality of, and/or describing any other definition of an aspect/feature/element of an embodiment of the subject matter being disclosed. Wherever any such definitive word or phrase or the like is used to describe an aspect/feature/element of any of the one or more embodiments disclosed herein, i.e., any feature, element, system, sub-system, component, sub-component, process or algorithm step, particular material, or the like, it should be read, for purposes of interpreting the scope of the subject matter of what applicant(s) has invented, and claimed, to be preceded by one or more, or all, of the following limiting phrases, "by way of example," "for example," "as an example," "illustratively only," "by way of illustration only," etc., and/or to include any one or more, or all, of the phrases "may be," "can be", "might be," "could be" and the like. All such features, elements, steps, materials and the like should be considered to be described only as a possible aspect of the one or more disclosed embodiments and not as the sole possible implementation of any one or more aspects/features/elements of any embodiments and/or the sole possible embodiment of the subject matter of what is claimed, even if, in fulfillment of the requirements of the patent statutes, Applicant(s) has disclosed only a single enabling example of any such aspect/feature/element of an embodiment or of any embodiment of the subject matter of what is claimed. Unless expressly and specifically so stated in the present application or the prosecution of this application, that Applicant(s) believes that a particular aspect/feature/element of any disclosed embodiment or any particular disclosed embodiment of the subject matter of what is claimed, amounts to the one an only way to implement the subject matter of what is claimed or any aspect/feature/element recited in any such claim, Applicant(s) does not intend that any description of any disclosed aspect/feature/element of any disclosed embodiment of the subject matter of what is claimed in the present patent application or the entire embodiment shall be interpreted to be such one and only way to implement the subject matter of what is claimed or any aspect/feature/element thereof, and to thus limit any claim which is broad enough to cover any such disclosed implementation along with other possible implementations of the subject matter of what is claimed, to such disclosed aspect/feature/element of such disclosed embodiment or such disclosed embodiment. Applicant(s) specifically, expressly and unequivocally intends that any claim that has depending from it a dependent claim with any further detail of any aspect/feature/element, step, or the like of the subject matter of what is claimed recited in the parent claim or claims from which it directly or indirectly depends, shall be interpreted to mean that the recitation in the parent claim(s) was broad enough to cover the further detail in the dependent claim along with other implementations and that the further detail was not the only way to implement the aspect/feature/element claimed in any such parent claim(s), and thus be limited to the further detail of any such aspect/feature/element recited in any such dependent claim to in any way limit the scope of the broader aspect/feature/element of any such parent claim, including by incorporating the further detail of the dependent claim into the parent claim.

The invention claimed is:

1. An illumination optical system which illuminates an illumination target surface with light from a light source, comprising:
   a distribution forming optical system having an optical integrator which has a plurality of optical surfaces, the plurality of optical surfaces being arrayed two-dimensionally on a plane intersecting with an optical path of the illumination optical system, the distribution forming optical system distributing a beam having passed through the optical integrator onto an illumination pupil of the illumination optical system;
   a condenser optical system arranged on an optical path of the beam traveling from the optical integrator to the illumination target surface, the condenser optical system superposing a plurality of beams from the plurality of optical surfaces on the illumination target surface: and
   a correction member arranged on a section of the optical path of the beam between the illumination pupil and the illumination target surface, the correction member changing an emission direction of the beam according to an incidence position of the beam.

2. The illumination optical system according to claim 1, wherein the correction member actively changes the emission direction of the beam.

3. The illumination optical system according to claim 1, wherein the correction member comprises a spatial light modulator with a plurality of optical elements arrayed two-dimensionally and controlled individually.

4. The illumination optical system according to claim 3, wherein the spatial light modulator has a plurality of mirror elements arrayed two-dimensionally, and a drive unit which individually controls and drives postures of the plurality of mirror elements.

5. The illumination optical system according to claim 4, wherein the drive unit continuously or discretely changes orientations of the plurality of mirror elements.

6. The illumination optical system according to claim 3, wherein the spatial light modulator has a plurality of variable angle prisms arrayed two-dimensionally, and a drive unit which individually controls and drives apex angles of the plurality of variable angle prisms.

7. The illumination optical system according to claim 1, wherein the correction member has a locally deformable reflecting surface.

8. The illumination optical system according to claim 1, wherein the correction member has a locally deformable refracting surface.

9. The illumination optical system according to claim 1, further comprising a light quantity distribution adjusting unit, the light quantity distribution adjusting unit changing an illuminance distribution on the illumination target surface or a shape of an illumination region formed on the illumination target surface.

10. The illumination optical system according to claim 9, wherein the light quantity distribution adjusting unit corrects influence of the correction member on a light quantity distribution on the illumination target surface.

11. The illumination optical system according to claim 1, used in combination with a projection optical system configured to form a plane optically conjugate with the illumination target surface, wherein the illumination pupil is a position optically conjugate with an aperture stop of the projection optical system.

12. The illumination optical system according to claim 1, further comprising a beam splitter arranged upstream of the correction member,
wherein the correction member can receive light via the beam splitter.

13. The illumination optical system according to claim 12, further comprising a beam combiner arranged downstream of the correction member,
wherein the beam combiner can receive light from the correction member and light from the beam splitter.

14. The illumination optical system according to claim 1, wherein the correction member includes a reflecting surface, and
wherein an optical path upstream the reflecting surface and an optical path downstream the reflecting surface are folded.

15. The illumination optical system according to claim 1, wherein the correction member corrects substantially all of the light traveling from the optical integrator to the illumination target surface.

16. The illumination optical system according to claim 15, wherein the correction member includes a reflecting surface, and
wherein an optical path upstream the reflecting surface and an optical path downstream the reflecting surface are folded.

17. An exposure apparatus comprising the illumination optical system as set forth in claim 1 configured to illuminate a predetermined pattern, the exposure apparatus performing exposure to expose a photosensitive substrate to the predetermined pattern.

18. The exposure apparatus according to claim 17, comprising a projection optical system configured to form an image of the predetermined pattern on the photosensitive substrate.

19. The exposure apparatus according to claim 18, further comprising:
a measuring unit, arrangeable downstream the projection optical system, measuring a pupil intensity distribution on a pupil plane of the projection optical system, on the basis of light having traveled via the projection optical system; and
a control unit, connectable to the measuring unit, controlling the correction member on the basis of the result of measurement by the measuring unit, in order to adjust the pupil intensity distribution to a required distribution.

20. A device manufacturing method, comprising:
performing exposure of the photosensitive substrate with the predetermined pattern, using the exposure apparatus as set forth in claim 17;
developing the photosensitive substrate with the predetermined pattern being transferred thereon, to form a mask layer in a shape corresponding to the predetermined pattern on a surface of the photosensitive substrate; and
processing the surface of the photosensitive substrate through the mask layer.

21. The illumination optical system according to claim 1, wherein the correction member is arranged at or near a position of the illumination pupil, or, arranged at or near a position optically conjugate with the illumination pupil.

22. The illumination optical system according to claim 1, further comprising:
a measuring unit which measures a pupil intensity distribution relevant to the beam incident on a predetermined point on the illumination target surface; and
a control unit which controls the correction member on the basis of the result of measurement by the measuring unit, in order to adjust the pupil intensity distribution to a required distribution.

23. The illumination optical system according to claim 22, wherein the measuring unit measures pupil intensity distributions relevant to beams respectively incident on a plurality of points which include the predetermined point and are on the illumination target surface.

24. An illumination optical system which illuminates an illumination target surface with light from a light source, comprising:
a distribution forming optical system having an optical integrator which has a plurality of optical surfaces, the plurality of optical surfaces being arrayed two-dimensionally on a plane intersecting with an optical path of the illumination optical system, the distribution forming optical system distributing a beam having passed through the optical integrator onto an illumination pupil of the illumination optical system;
a condenser optical system arranged on an optical path of the beam traveling from the optical integrator to the illumination target surface, the condenser optical system superposing a plurality of beams from the plurality of optical surfaces on the illumination target surface; and
a correction member arranged on a section of the optical path of the beam traveling between the illumination pupil and the illumination target surface, the correction member having a plurality of optical elements arrayed two-dimensionally and controlled individually.

25. The illumination optical system according to claim 24, wherein the plurality of optical elements actively change emission directions of beams emitted from the plurality of optical elements.

26. The illumination optical system according to claim 25, wherein the correction member unit is arranged at or near a position of the illumination pupil, or, arranged at or near a position optically conjugate with the illumination pupil.

27. The illumination optical system according to claim 24, further comprising:
a measuring unit which measures a pupil intensity distribution relevant to the beam incident on a predetermined point on the illumination target surface; and
a control unit which controls the correction member on the basis of the result of measurement by the measuring unit, in order to adjust the pupil intensity distribution to a required distribution.

28. The illumination optical system according to claim 27, wherein the measuring unit measures pupil intensity distributions relevant to beams respectively incident on a plurality of points which include the predetermined point and are on the illumination target surface.

* * * * *

UNITED STATES PATENT AND TRADEMARK OFFICE
CERTIFICATE OF CORRECTION

PATENT NO. : 8,913,227 B2  
APPLICATION NO. : 12/929944  
DATED : December 16, 2014  
INVENTOR(S) : Osamu Tanitsu Page 1 of 1

It is certified that error appears in the above-identified patent and that said Letters Patent is hereby corrected as shown below:

In the Claims

Column 24, Line 26, In Claim 1, delete "surface:" and insert -- surface; --, therefor.

Signed and Sealed this
Fifth Day of May, 2015

Michelle K. Lee  
*Director of the United States Patent and Trademark Office*